(12) United States Patent
Yada et al.

(10) Patent No.: US 11,967,565 B2
(45) Date of Patent: Apr. 23, 2024

(54) SEMICONDUCTOR DEVICES INCLUDING CONDUCTIVE STRUCTURE AND SHIELDING LAYER AND METHODS OF MANUFACTURING SEMICONDUCTOR DEVICES

(71) Applicant: Amkor Technology Japan, Inc., Oita (JP)

(72) Inventors: Takahiro Yada, Ishikawa (JP); Tsukasa Takaiwa, Kumamoto (JP)

(73) Assignee: Amkor Technology Japan, Inc., Oita (JP)

( * ) Notice: Subject to any disclaimer, the term of this patent is extended or adjusted under 35 U.S.C. 154(b) by 0 days.

(21) Appl. No.: 17/839,245

(22) Filed: Jun. 13, 2022

(65) Prior Publication Data

US 2022/0375873 A1 Nov. 24, 2022

Related U.S. Application Data

(63) Continuation of application No. 16/720,686, filed on Dec. 19, 2019, now Pat. No. 11,362,041.

(51) Int. Cl.
| | |
|---|---|
| *H01L 23/552* | (2006.01) |
| *H01L 21/56* | (2006.01) |
| *H01L 21/768* | (2006.01) |
| *H01L 23/522* | (2006.01) |
| *H01L 23/00* | (2006.01) |

(52) U.S. Cl.
CPC ............ *H01L 23/552* (2013.01); *H01L 21/56* (2013.01); *H01L 21/768* (2013.01); *H01L 23/5226* (2013.01); *H01L 24/45* (2013.01)

(58) Field of Classification Search
CPC ..... H01L 23/552; H01L 21/56; H01L 21/768; H01L 23/5226; H01L 24/45
USPC ........................................................ 257/659
See application file for complete search history.

(56) References Cited

U.S. PATENT DOCUMENTS

| | | | |
|---|---|---|---|
| 7,960,818 B1 | 6/2011 | Davis et al. | |
| 8,729,682 B1 | 5/2014 | Davis et al. | |
| 2008/0272469 A1* | 11/2008 | Kwak | H01L 23/3121 |
| | | | 257/659 |
| 2010/0171201 A1 | 7/2010 | Wyant et al. | |
| 2012/0218729 A1 | 8/2012 | Carey et al. | |
| 2015/0171022 A1* | 6/2015 | Sirinorakul | H01L 23/3135 |
| | | | 257/659 |
| 2016/0035680 A1 | 2/2016 | Wu | |
| 2017/0118877 A1* | 4/2017 | Kumbhat | H01L 25/16 |
| 2017/0179041 A1 | 6/2017 | Dias et al. | |
| 2017/0186699 A1 | 6/2017 | Li et al. | |
| 2017/0200682 A1 | 7/2017 | Lin et al. | |

(Continued)

*Primary Examiner* — Didarul A Mazumder
(74) *Attorney, Agent, or Firm* — Spectrum IP Law Group LLC

(57) ABSTRACT

In one example, a semiconductor structure or device comprises a substrate comprising a conductive structure having a top side and a first shielding terminal on the top side of the conductive structure, an electronic component on the top side of the conductive structure, a package body on the top side of the conductive structure and contacting a side of the electronic component, a shield on a top side of the package body and a lateral side of the package body, and a shield interconnect coupling the shield to the first shielding terminal of the conductive structure. Other examples and related methods are also disclosed herein.

16 Claims, 26 Drawing Sheets

(56) References Cited

U.S. PATENT DOCUMENTS

| | | | |
|---|---|---|---|
| 2017/0330839 A1 | 11/2017 | Kim et al. | |
| 2017/0345793 A1* | 11/2017 | Miyairi | H01L 24/02 |
| 2019/0122992 A1* | 4/2019 | Yang | H01L 23/49558 |
| 2020/0373273 A1* | 11/2020 | Lear | H01L 23/3107 |

* cited by examiner

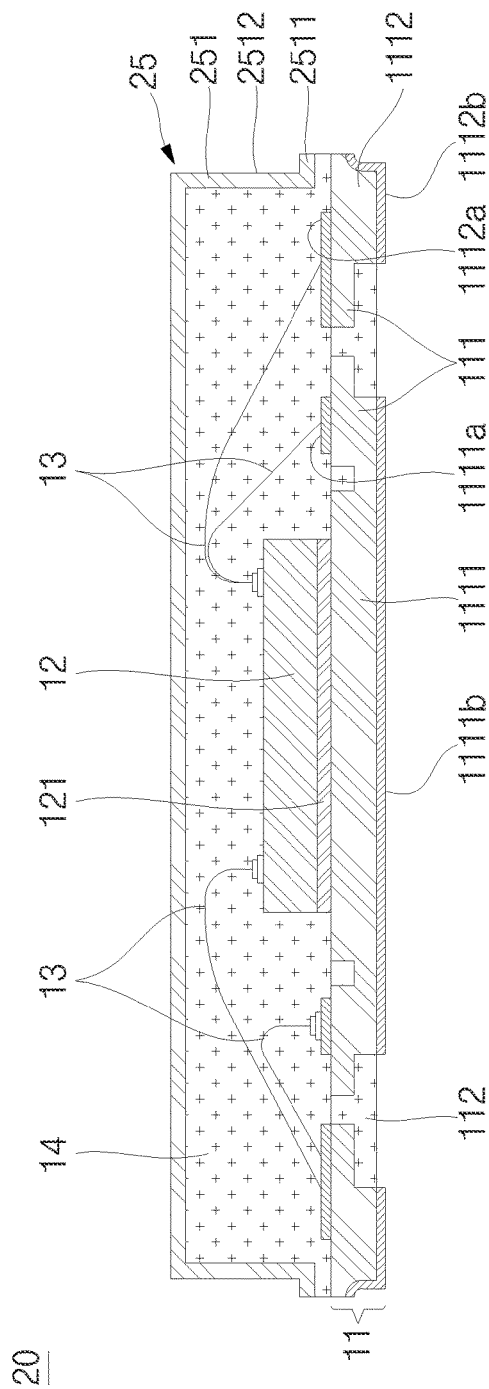
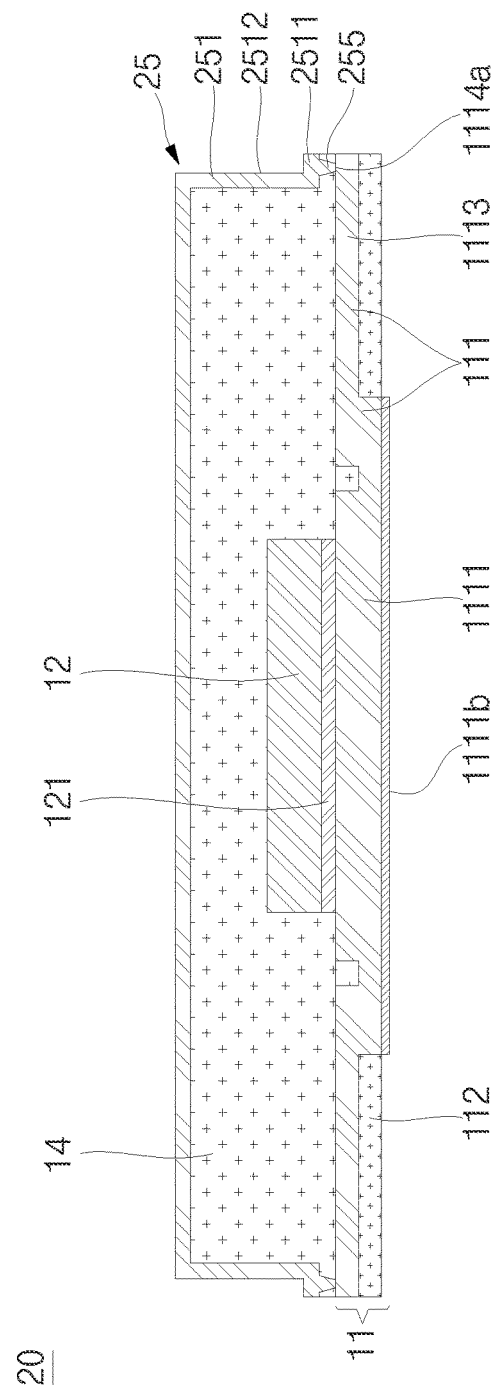
FIG. 4A
FIG. 4B

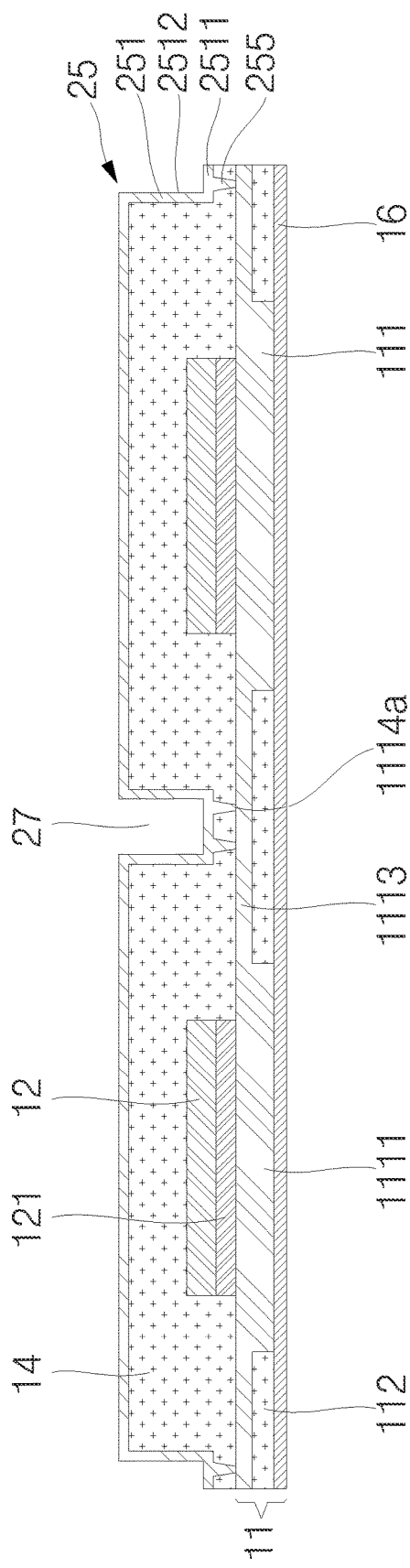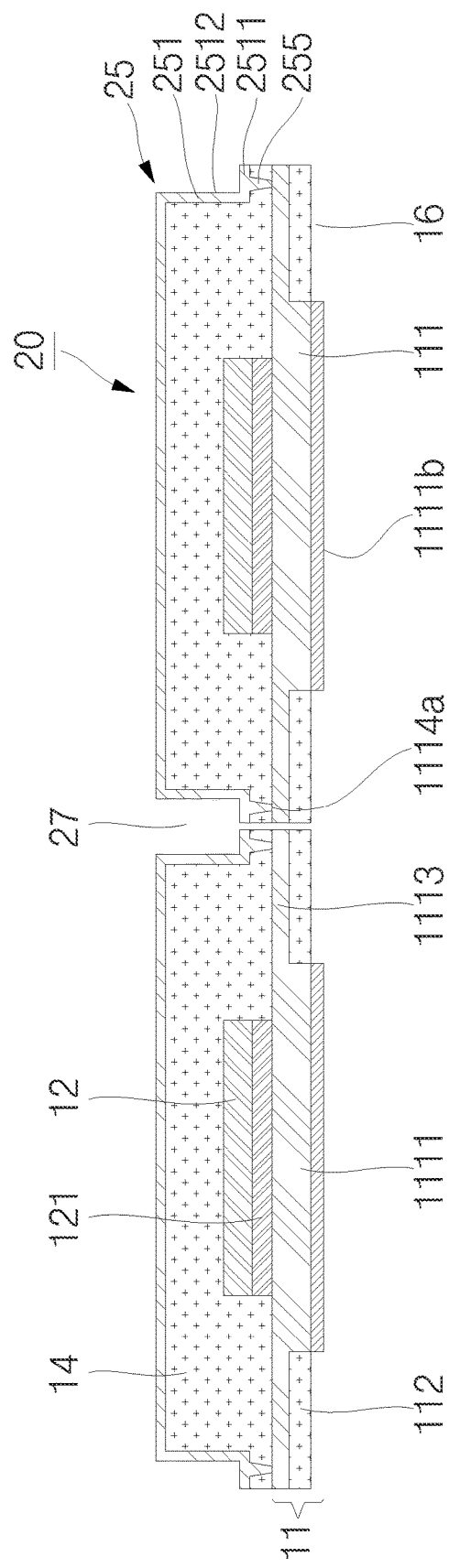

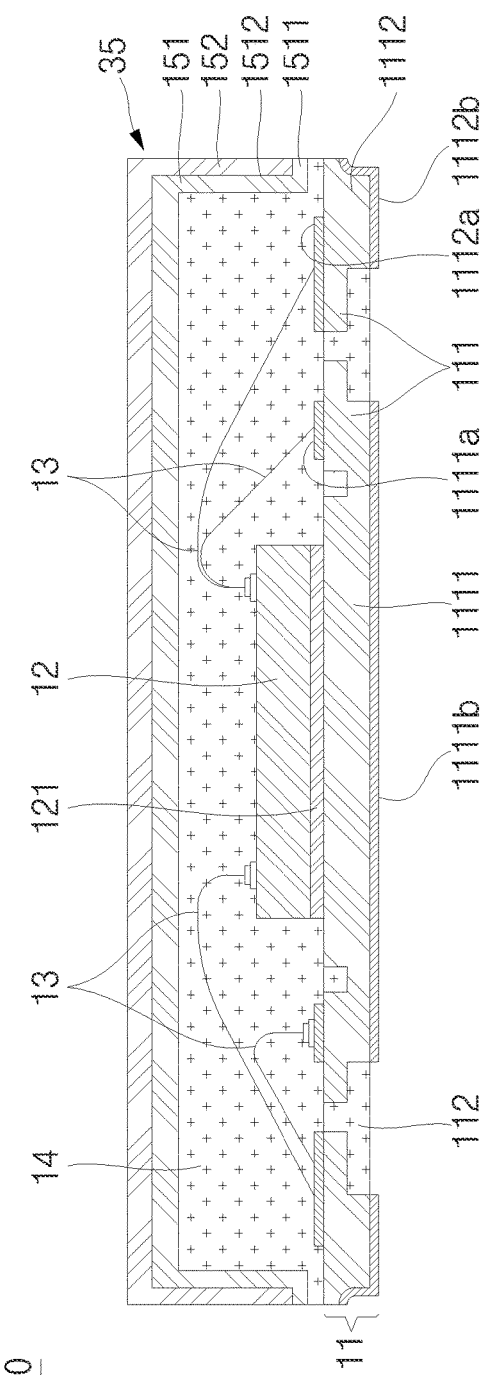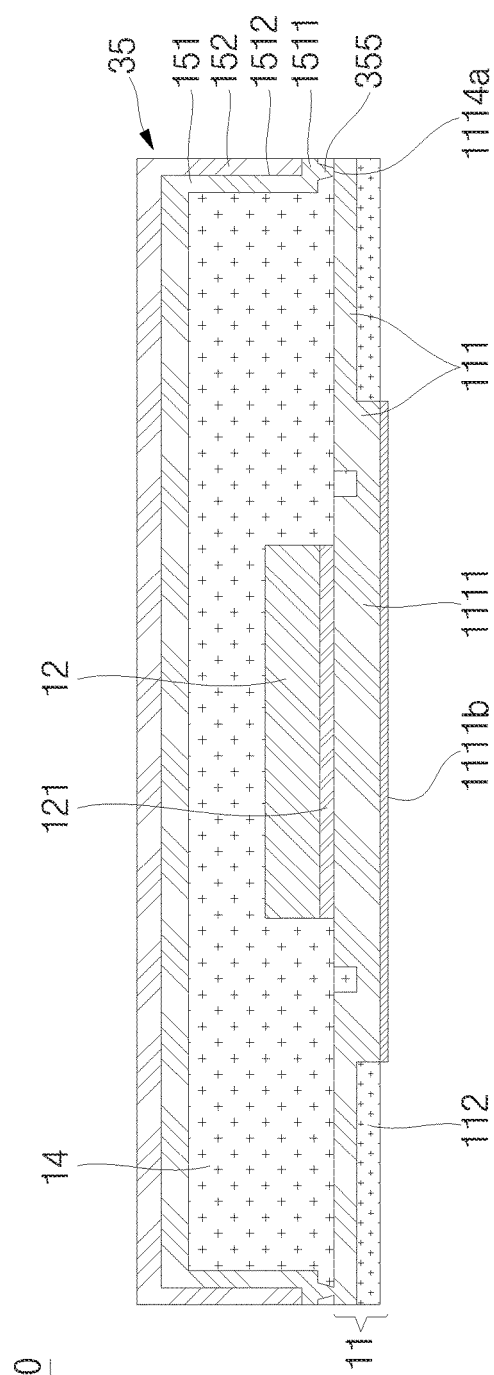

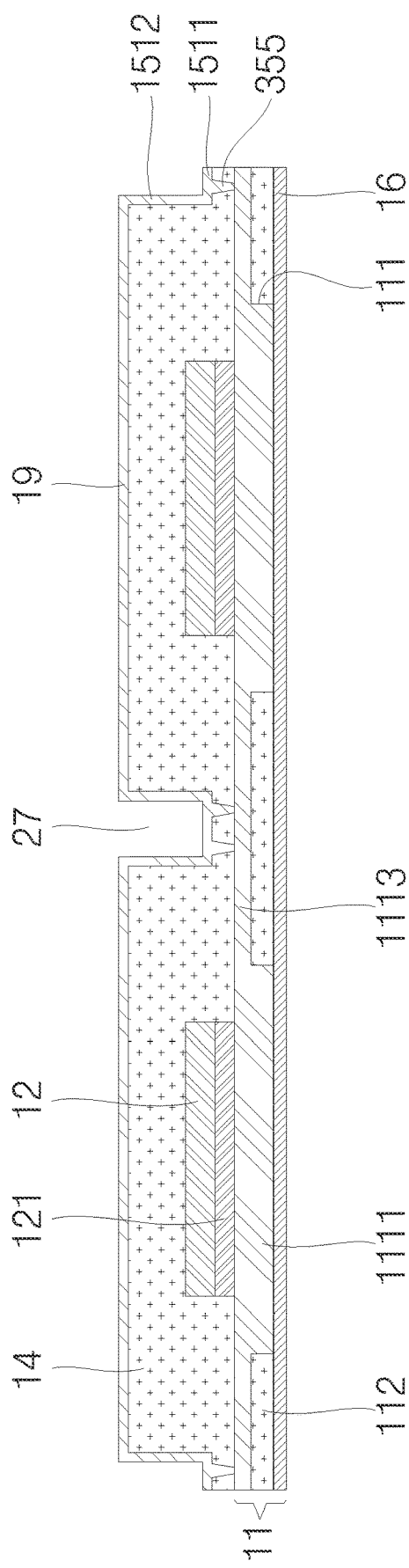
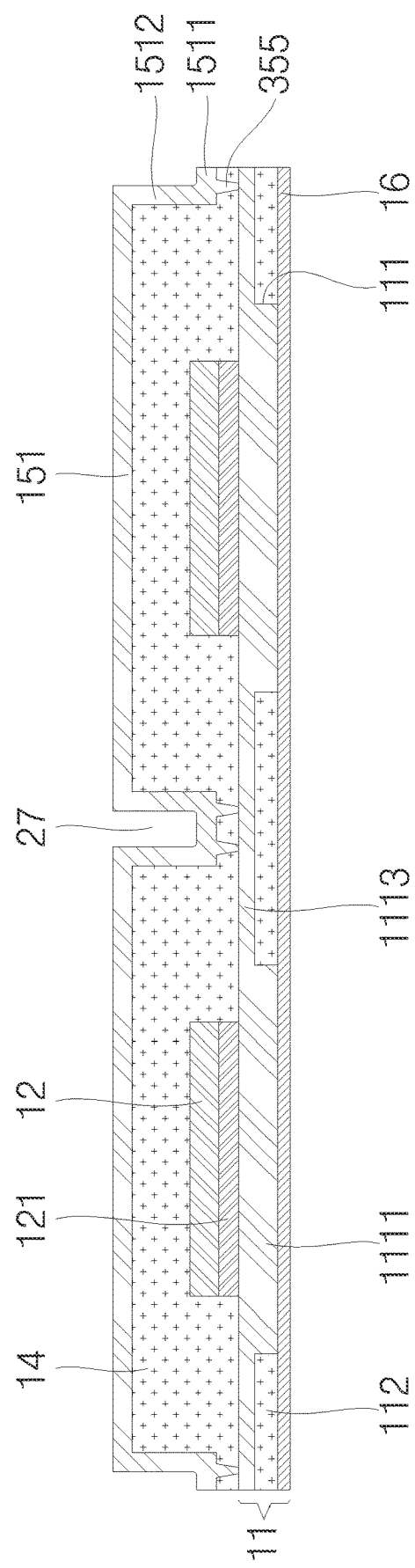
FIG. 7A
FIG. 7B

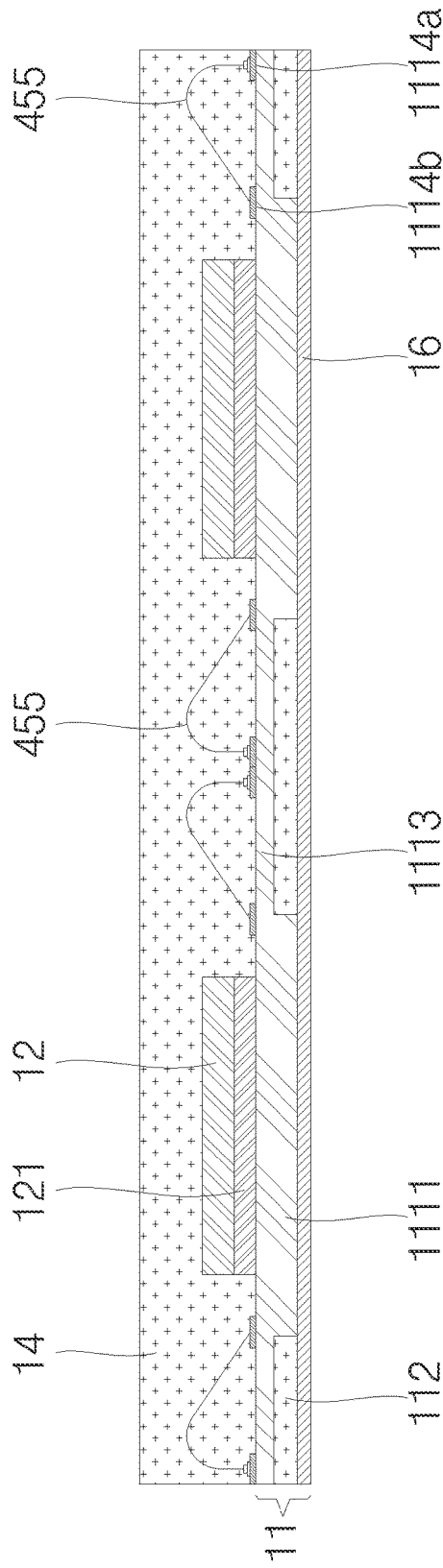
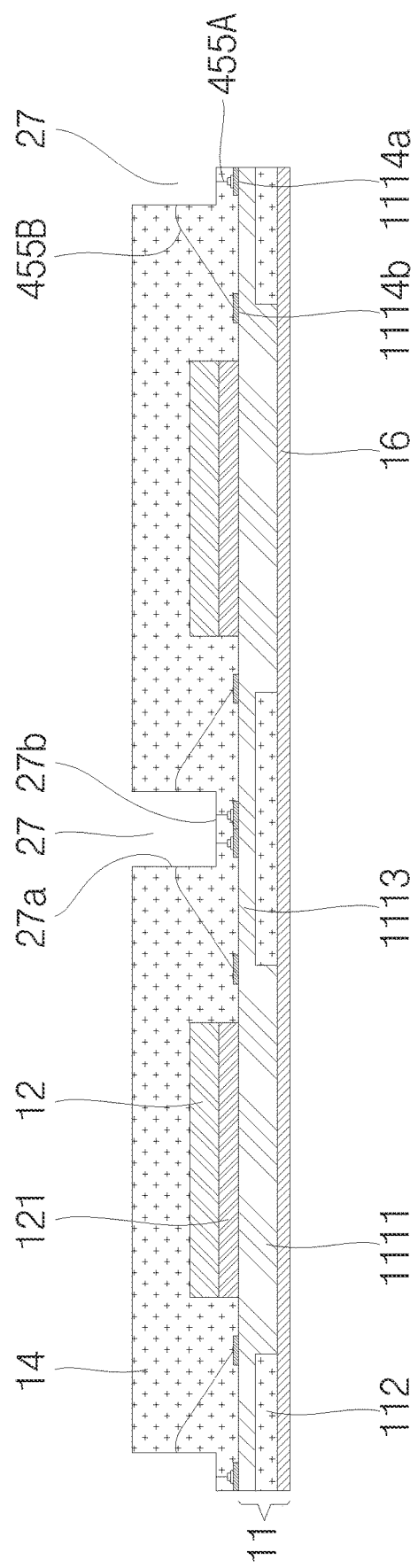
FIG. 10A
FIG. 10B

SEMICONDUCTOR DEVICES INCLUDING CONDUCTIVE STRUCTURE AND SHIELDING LAYER AND METHODS OF MANUFACTURING SEMICONDUCTOR DEVICES

CROSS-REFERENCE TO RELATED APPLICATIONS

The present application is a continuation of U.S. application Ser. No. 16/720,686 filed Dec. 19, 2019 (pending). Said application Ser. No. 16/720,686 is hereby incorporated herein by reference in its entirety.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 4A and 4B show cross-sectional views of an example semiconductor device.

FIGS. 5A to 5D show cross-sectional views of an example method for manufacturing an example semiconductor device.

FIGS. 6A and 6B show cross-sectional views of an example semiconductor device.

FIGS. 7A to 7D show cross-sectional views of an example method for manufacturing an example semiconductor device.

FIGS. 10A to 10D show cross-sectional views of an example method for manufacturing an example semiconductor device.

Figure 1:
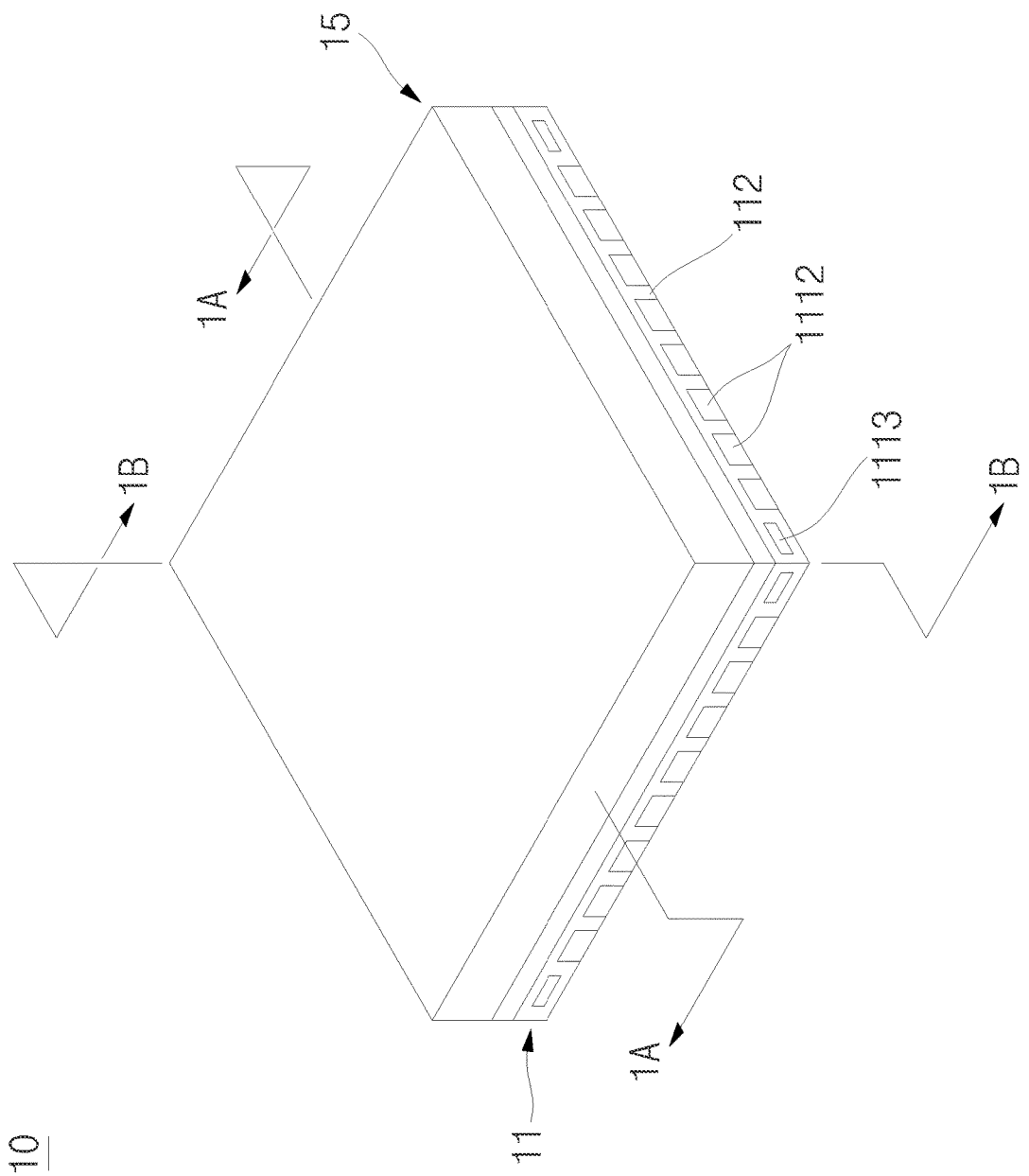
FIG. 1 shows a perspective view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

The terms "comprises," "comprising," "includes," or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor structure comprises a substrate comprising a conductive structure having a top side and a first shielding terminal on the top side of the conductive structure, an electronic component on the top side of the conductive structure, a package body on the top side of the conductive structure and contacting a side of the electronic component, a shield on a top side of the package body and a lateral side of the package body, and a shield interconnect coupling the shield to the first shielding terminal of the conductive structure.

In another example, a method to manufacture a semiconductor device comprises providing a substrate comprising a dielectric structure and a conductive structure having a top side and a shielding terminal on the top side of the conductive structure, providing an electronic component on the top side of the conductive structure, providing a package body on the top side of the conductive structure and contacting a side of the electronic component, providing a via in the package body from a top side of the package body to the shielding terminal, and providing a shield on a top side of the package body and a lateral side of the package body, wherein the shield includes a shield interconnect in the via connecting the shield to the shielding terminal of the conductive structure.

In a further example, a semiconductor structure or semiconductor device comprises a substrate comprising a dielectric structure and a conductive structure having a top side, a paddle, and a shielding terminal on the top side of the conductive structure, a first electronic component on the top side of the conductive structure on the paddle, and a second electronic component on the top side of the conductive structure on the paddle, a package body on the top side of the conductive structure and contacting a side of the first electronic component and a side of the second electronic component, a shield on a top side of the package body and a side surface of the package body, a shield wall between the first electronic component and the second electronic component and contacting the shield, and a shield interconnect coupling the shield to the shielding terminal of the conductive structure.

Other examples are included in the present disclosure. Such examples may be found in the figures, in the claims, or in the description of the present disclosure.

Figure 1A:
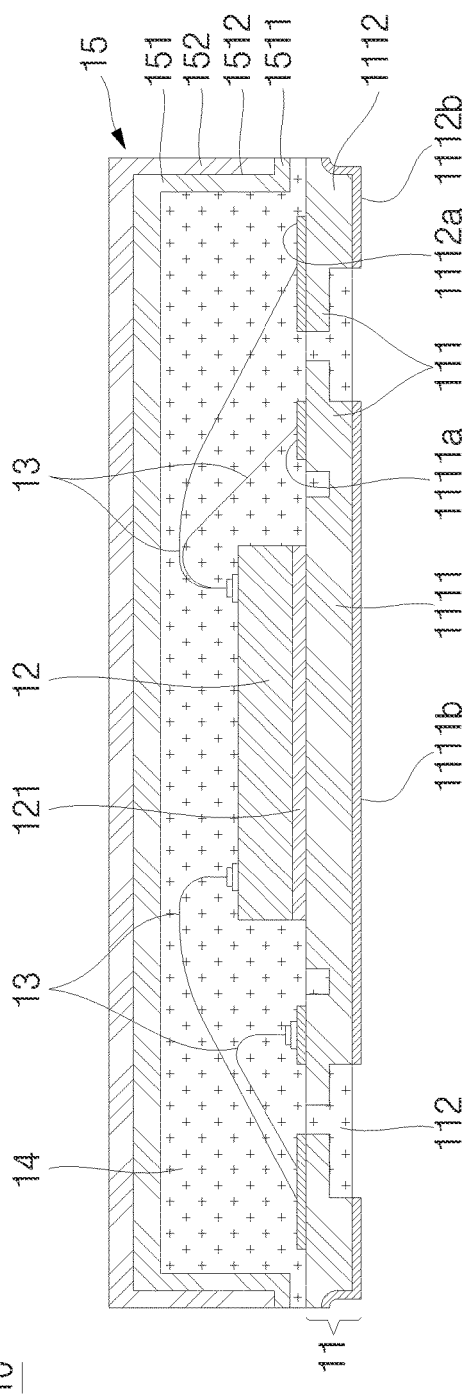
FIGS. 1A and 1B show cross-sectional views of an example semiconductor device.
Figure 1B:
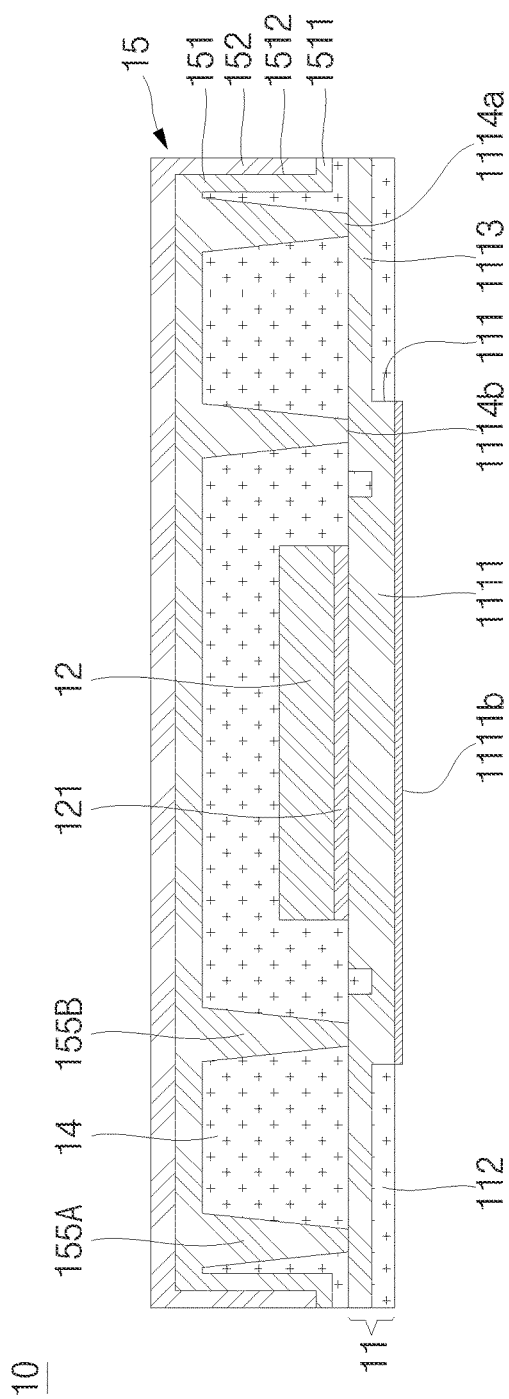

FIG. 1 shows a perspective view of an example semiconductor device 10, and FIGS. 1A and 1B show cross-sectional views taken along line 1A-1A and 1B-1B of FIG. 1, respectively. In the examples shown in FIGS. 1, 1A, and 1B, semiconductor device 10 can comprise substrate 11, electronic component 12, component interconnects 13, package body 14, and shield 15.

Substrate 11 can comprise conductive structure 111 and dielectric structure 112. Conductive structure 111 can comprise paddle 1111, paddle top pad 1111a, paddle bottom pad 1111b, interconnect terminals 1112, interconnect terminal top pad 1112a, interconnect terminal bottom pad 1112b, support bars 1113, and shielding terminals 1114a on support bars 1113, and shielding terminals 1114b on paddle 1111. In some examples, pads 1111a, 1111b, 1112a, or 1112b can comprise or be referred to a platings or bumps. Adhesive 121 can be located between electronic component 12 and substrate 11. A component interconnect 13 can connect electronic component 12 to interconnect terminal top pad 1112a positioned on interconnect terminals 1112. A component interconnect 13 can connect electronic component 12 to paddle top pad 1111a positioned on paddle 1111. A component interconnect 13 can connect paddle top pad 1111a positioned on paddle 1111 to interconnect terminal top pad 1112a positioned on interconnect terminals 1112. Shield 15 can comprise shield layers 151 and 152, ridge ledges 1511, ridges 1512, and shield interconnects 155A and 155B.

Substrate 11, package body 14, and shield 15 can be referred to as a semiconductor package and package can provide protection for electronic component 12 from external elements or environmental exposure. Semiconductor package can provide electrical coupling between external electrical components and substrate.

In some examples, semiconductor device 10 can be a semiconductor structure including substrate 11 comprising conductive structure 111 having a top side and a first shielding terminal 1114a or 1114b on the top side of conductive structure 111. The semiconductor structure can include an electronic component 12 on the top side of conductive structure 111, package body 14 on the top side of conductive structure 111 and contacting a side of electronic component 12. The semiconductor structure further can include shield 15 on a top side of package body 14 and a lateral side of package body, and shield interconnect 155A or 155B coupling shield 15 to the first shielding terminal 1114a or 1114b of conductive structure 111. In some examples, the shield 15 can comprise first shield layer 151 and second shield layer 152.

In some examples, dielectric structure 112 can be coupled to conductive structure 111. In some examples, dielectric structure 112 can comprise part of package body 14 as a continuous material. In other examples, dielectric structure 112 can be separate from package body 14. In some examples, shield 15 can contact a groove 18 in package body 14 at a lateral side of package body 14. In some examples, first shield layer 151 can have a ridge 1512 and a ridge ledge 1511 at a lateral side of package body 14. In such an arrangement, the second shield layer 152 can be on the ridge ledge 1511 at the lateral side of package body 14. In some examples, conductive structure 111 can include a paddle 1111 adjacent to electronic component 12. The first shielding terminal 1114a or 1114b can be on paddle 1111, and the shield interconnect 155A or 155B can couple the shield 111 to the paddle 1111.

In some examples, the conductive structure 111 can include a paddle 1111 adjacent to electronic component 12, and the first shielding terminal 1114a or 1114b is on one of a support bar 1113 or a lead of the conductive structure 111. A second shielding terminal 1114a or 1114b can be on the paddle 1111, and the shield interconnect 155A or 155B can be coupled to the first shielding terminal 1114a or 1114b, the second shielding terminal 1114a or 1114b, and shield 15.

Figure 2A:
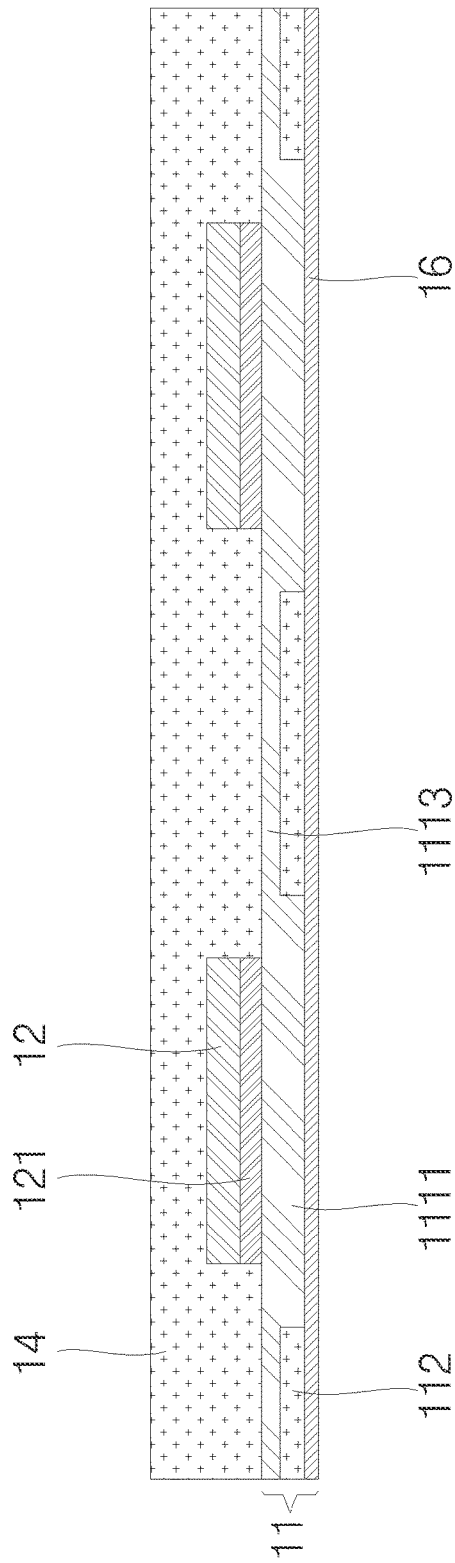
FIGS. 2A to 2G show cross-sectional views of an example method for manufacturing an example semiconductor device.

FIGS. 2A to 2G show cross-sectional views of an example method for manufacturing semiconductor device 10 of FIG. 1, and their description below is supplemented by FIG. 1. FIGS. 2A to 2G correspond to cross-sectional views taken along line 1B-1B of FIG. 1. FIG. 2A shows a cross-sectional view of semiconductor device 10 at an early stage of manufacture.

In the example of FIG. 2A, a semi-finished semiconductor device can be provided on carrier 16. In some examples, semi-finished semiconductor device can comprise substrate 11, electronic component 12 attached onto substrate 11 using adhesive 121, component interconnects 13 (see FIG. 1A) electrically connecting substrate 11 and electronic component 12, and package body 14. In order to enhance manufacturability, multiple semiconductor devices can be arranged on one carrier 16 in a matrix configuration. Here, multiple semi-finished semiconductor devices are shown connected to one another.

Carrier 16 can comprise or can be referred to as a back tape or a lead frame tape, and can fix paddle 1111, interconnect terminals 1112, or support bars 1113 of substrate 11 during an encapsulation process. Carrier 16 can have heat resistance and chemical resistance to maintain the shape of semiconductor device 10 without distortion or warpage during the manufacture of semiconductor device. In some examples, carrier 16 can comprise an adhesive layer that loses its adhesiveness due to heat or light exposure.

Substantially planar substrate 11 can be attached onto the adhesive layer of carrier 16. Substrate 11 can comprise or can be referred to as a lead frame, a laminate substrate, a redistribution layer (RDL) substrate or a molded substrate. In some examples, substrate 11 can comprise conductive structure 111 comprising paddle 1111, interconnect terminals 1112 and support bars 1113. Substrate 11 can further comprise dielectric structure 112 coupled to conductive structure 111. Conductive structure 111 can comprise or can be referred to as one or more traces, leads, paths, vias, paddles, support bars, conductors, conductive layers or conductive materials. In some examples, conductive structure 111 can comprise copper, nickel, iron, aluminum, stainless steel or alloys. Dielectric structure 112 can comprise or can be referred to as one or more dielectrics, dielectric layers, resin, epoxy, molding compound, pre-preg, or dielectric material. Paddle 1111 can comprise a top side and a bottom side opposite to the top side. Paddle 1111 can comprise or can be referred to as a die pad, a die flag, or a component attachment portion of substrate 11. Paddle 1111 can have a thickness in the range from approximately 125 microns (μm) to approximately 200 μm. Electronic component 12 can be coupled to paddle 1111 using adhesive 121 or component interconnects 13. Paddle 1111 can later be electrically connected to an external device through paddle bottom side or paddle bottom pad 1111b.

Interconnect terminals 1112 can be arranged spaced apart from paddle 1111. In some examples interconnect terminals 1112 can comprise or can be referred to as leads or pads. Interconnect terminals 1112 can have a thickness in the range from approximately 125 μm to approximately 200 μm. Interconnect terminals 1112 can be electrically connected to electronic component 12 through component interconnects 13. Interconnect terminals 1112 can later be electrically connected to an external device through paddle bottom pad 1112b. Support bars 1113 can extend from paddle 1111. Support bars 1113 can comprise or can be referred to as tie-bars, connecting-bars, pads, or traces to which shielding can be coupled. Support bars 1113 can have a thickness smaller than or equal to the thickness of paddle 1111 or interconnect terminals 1112, and bottom sides of support bars 1113 can be covered by dielectric structure 112. In some examples, top sides of support bars 1113 can be coplanar with top sides of paddle 1111 and interconnect terminals 1112. Support bars 1113 can have a thickness in the range from approximately 125 μm to approximately 200 μm. Support bars 1113 can later be electrically connected to shield 15. In some examples, support bars 1113 can be electrically connected to paddle 1111 or interconnect terminals 1112. In some examples, conductive structure 111 can comprise support bar 1113, and the first shielding terminal 1114a or 1114b can be on support bar 1113.

Electronic component 12 can be attached onto paddle 1111 using adhesive 121. Electronic component 12 can comprise or can be referred to as a chip, a die, a package, or a passive device. Electronic component 12 can have a thickness in the range from approximately 75 μm to approximately 250 μm. If an active side or circuitry side of electronic component 12 faces upward, electronic component 12 can be electrically connected to paddle 1111 or interconnect terminals 1112 through component interconnects 13. In some examples, component interconnects 13 can comprise or can be referred to as wires or wire bonds. Component interconnects 13 can have a diameter in the range from approximately 10 μm to approximately 50 μm. If an active side or circuitry side of electronic component 12 faces downward, electronic component 12 can be electrically connected to paddle 1111 or interconnect terminals 1112 in the form of a flip chip. If electronic component 12 is of flip chip type, underfill can be further located between electronic component 12 and substrate 11. In some examples, component interconnects 13 can comprise or can be referred to as bumps or pillars.

Package body 14 can cover substrate 11, electronic component 12, and component interconnects 13. In some examples, dielectric structure 112 of substrate 11 and package body 14 can be part of each other or can comprise a same or continuous dielectric material or layer. Package body 14 can comprise or can be referred to as an encapsulant, a mold compound, a resin, a sealant, or an organic body. Package body 14 can be prepared by covering substrate 11, electronic component 12, and component interconnects 13 using a compression molding process, an injection molding process, a transfer molding process, or a film assist molding process. Package body 14 can have a thickness in the range from approximately 200 μm to approximately 1500 μm. Package body 14 can provide protection for substrate 11, electronic component 12, and component interconnects 13 from external elements or environmental exposure.

In some examples, substrate 11 can be a redistribution layer ("RDL") substrate. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. Thus, the dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of one or more inorganic dielectric layers can comprise silicon nitride ($Si_3N_4$), silicon oxide ($SiO_2$), or silicon oxynitride (SiON). The one or more inorganic dielectric layers can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate.

In some examples, substrate 11 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can be referred to as a printed circuit board (PCB) or a laminate substrate. Such pre-formed substrate can be formed through a semi-additive or modified-semi-additive process.

Figure 2B:
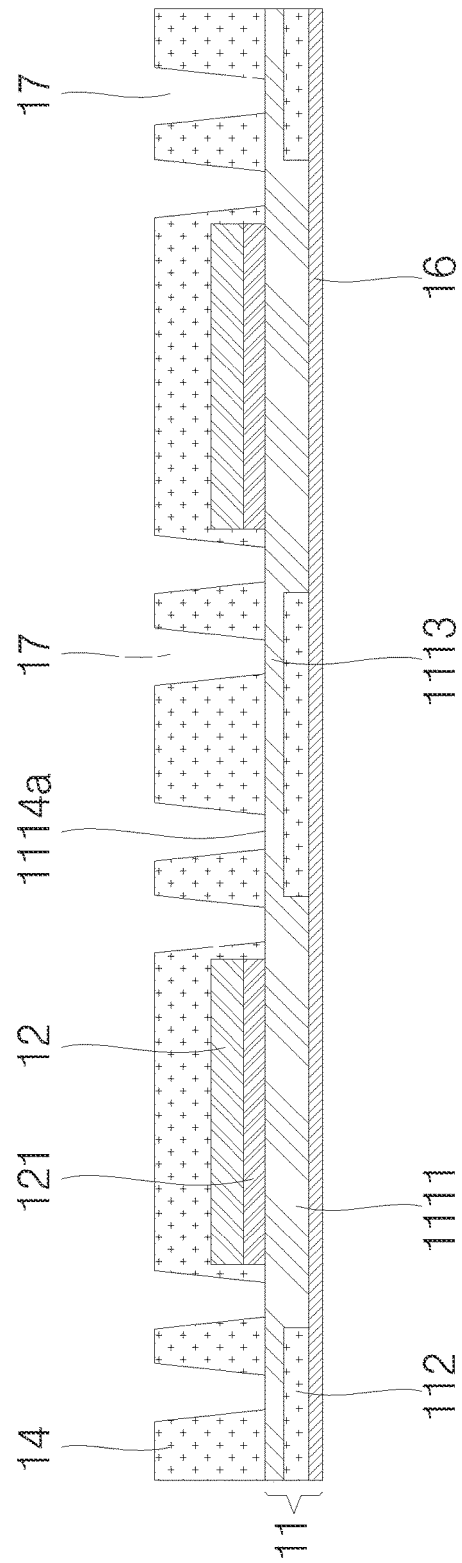

FIG. 2B shows a cross-sectional view of semiconductor device 10 at a later stage of manufacture. In the example shown in FIG. 2B, vias 17 can be defined in package body 14. Vias 17 can comprise or can be referred to as openings or through holes. Vias 17 can be formed through laser beam, mechanical drilling, or chemical etching. In some examples, vias 17 can be formed in regions corresponding to portions of support bars 1113. In some examples, the diameters of vias 17 can be the largest at the top ends and can be gradually reduced downwardly toward the lower ends. Vias 17 can have a diameter in the range from approximately 50 μm to approximately 300 μm. In some examples, vias 17 can have a height in the range from approximately 225 μm to approximately 1000 μm. Vias 17 can pass through package body 14 to expose the top side regions of support bars 1113. Top side regions of support bars 1113 exposed through package body 14 can be referred to as shielding terminals 1114a. In some examples, vias 17 can comprise or be defined by one or more shield interconnects in package body 14.

Figure 2C:
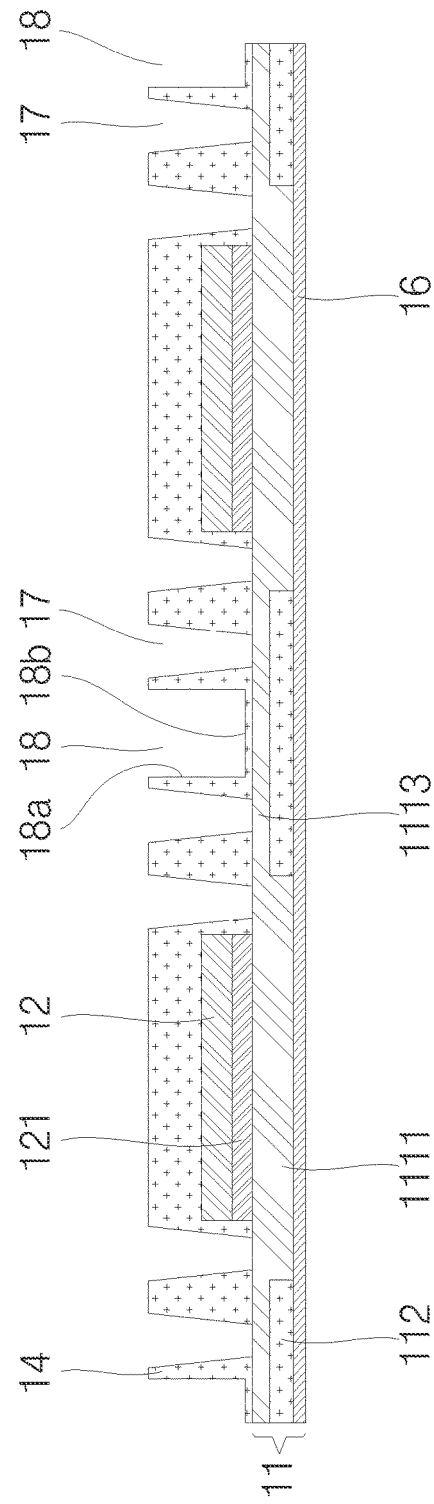

FIG. 2C shows a cross-sectional view of semiconductor device 10 at a later stage of manufacture. In the example shown in FIG. 2C, grooves 18 can be formed in package body 14. Grooves 18 can comprise or can be referred to as trenches or channels. Grooves 18 can be formed by laser beam, mechanical drilling, a blade wheel, or chemical etching. In some examples, grooves 18 can be formed in regions corresponding to support bars 1113 or regions to be singulated in a later process. Each of grooves 18 can have a lateral side 18a and a bottom side 18b. Lateral side 18a of each groove 18 can be substantially perpendicular to top side of substrate 11, and bottom side 18b of each groove 18 can be substantially parallel to top side of substrate 11. Grooves 18 can have smaller depths than vias 17, and a portion of package body 14 can remain under bottom side 18b of groove 18. The region of package body 14 remaining under bottom side 18b of groove 18 can have a thickness in the range from approximately 50 μm to approximately 150 μm. Grooves 18 (bottom side 18b) can have a width in the range from approximately 100 μm to approximately 700 μm. Lateral side 18a and bottom side 18b of groove 18 can provide a region where shield 15 is formed in a later process.

Figure 2D:
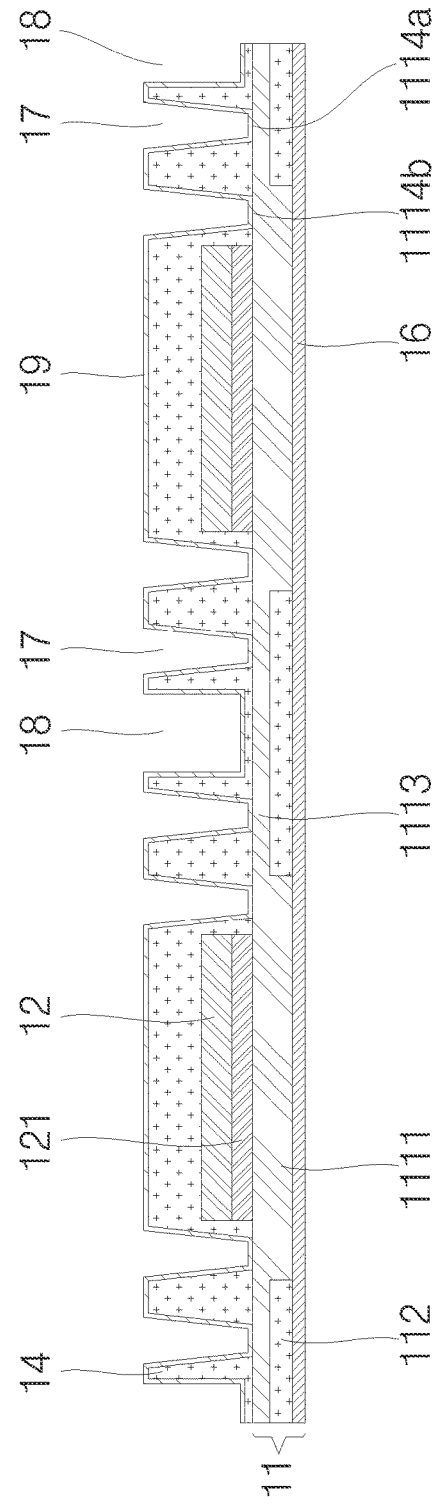

FIG. 2D shows a cross-sectional view of semiconductor device 10 at a later stage of manufacture. In the example shown in FIG. 2D, seed layer 19 can be formed on package body 14. In some examples, seed layer 19 can be formed on package body 14, vias 17, and grooves 18. Seed layer 19 can also be formed on regions of support bars 1113 exposed by vias 17, such as shielding terminals 1114a, or on regions of paddle 1111 exposed by vias 17, such as shielding terminals 1114b. Seed layer 19 can comprise or can be referred to as a conductive layer. In some examples, seed layer 19 can be made from tungsten, tungsten titanium or copper. In some examples, seed layer 19 can be formed through electroless plating or sputtering. In some examples, prior to forming seed layer 19, de-smearing can be further performed to improve adhesiveness with seed layer 19 by removing epoxy smear that can exist in vias 17 or grooves 18 or increasing roughness. Seed layer 19 can have a thickness in the range from approximately 1 μm to approximately 3 μm. Seed layer 19 can apply power to a plating solution in a later process for forming shield 15.

Figure 2E:
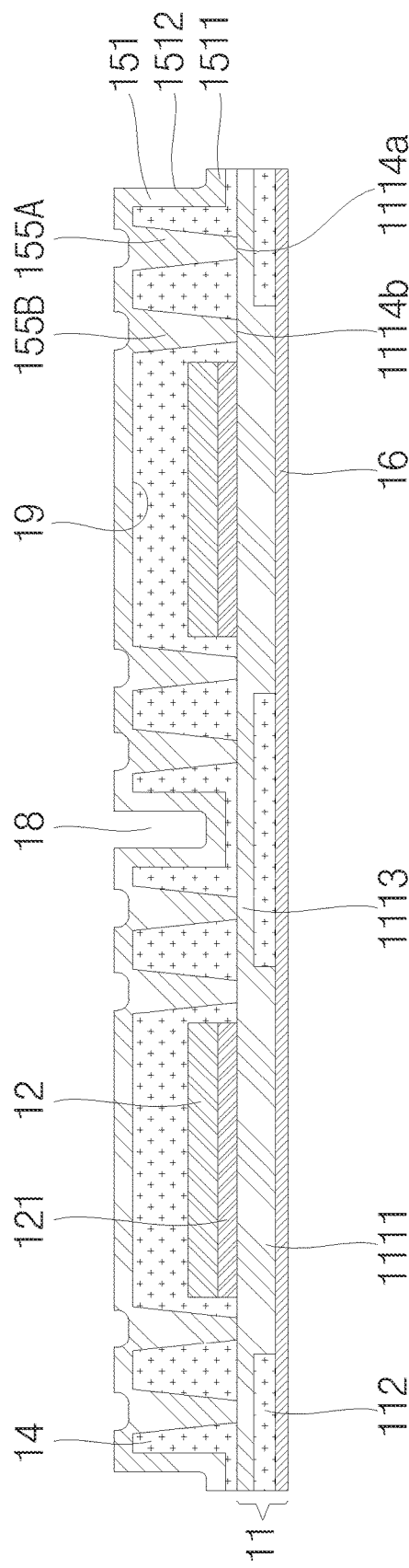

FIG. 2E shows a cross-sectional view of semiconductor device 10 at a later stage of manufacture. In the example shown in FIG. 2E, shield layer 151 can be formed on seed layer 19. In some examples, shield layer 151 can be formed on seed layer 19 located on top side of package body 14, seed layer 19 located on vias 17, and seed layer 19 located on grooves 18. In some examples, shield layer 151 can fill vias 17. Shield layer 151 filling vias 17 can be electrically connected to shielding terminals 1114a on support bars 1113, or to shielding terminals 1114b on die paddle 1111. Shield layer 151 filling vias 17 can be defined as shield interconnects 155A and 155B. Heights and diameters of shield interconnects 155A can be similar to those of vias 17 and can be in ranges from approximately 225 μm to approximately 1000 μm or from approximately 50 μm to approximately 300 μm. In some examples, a region of shield layer 151 located on lateral side 18a of groove 18 can be defined as ridge 1512, and a region of shield layer 151 located on a region corresponding to bottom side 18b of groove 18 can be defined as ridge ledge 1511. In some examples, shield layer 151 can be formed by electroplating aluminum or copper on seed layer 19. Shield layer 151 can have a thickness in the range from approximately 10 μm to approximately 20 μm. Shield layer 151 can prevent electromagnetic wave from being transmitted from an external component to electronic component 12 or can prevent electromagnetic wave from being transmitted from electronic component 12 to an external component.

Figure 2F:
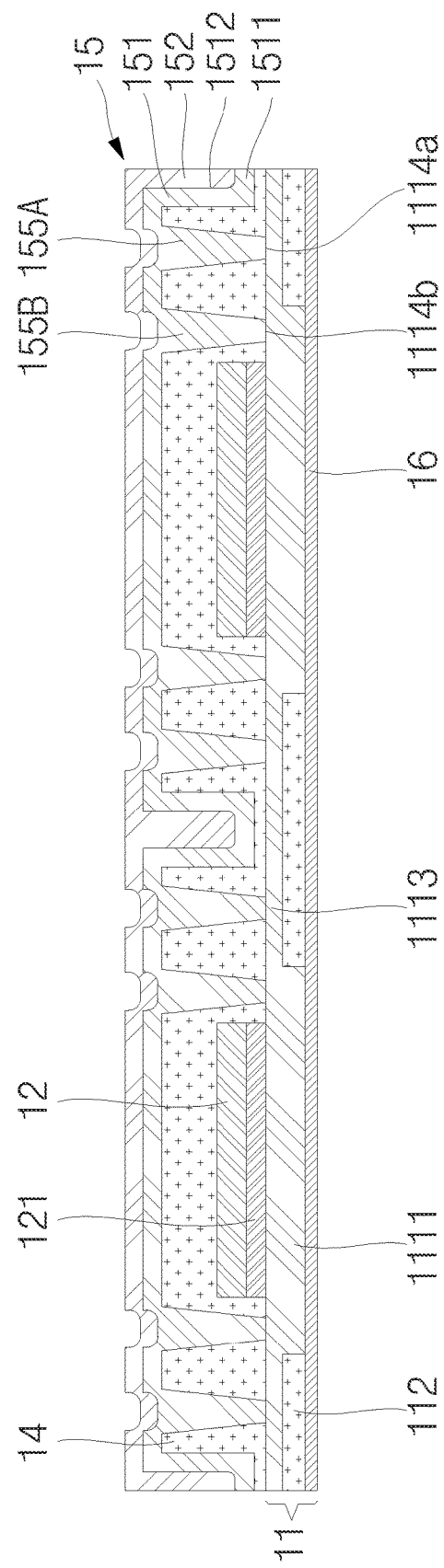

FIG. 2F shows a cross-sectional view of semiconductor device 10 at a later stage of manufacture. In the example shown in FIG. 2F, another shield layer 152 can be formed on shield layer 151. In some examples, shield layer 152 can be formed on shield layer 151 located on package body 14, shield layer 151 located in vias 17, and shield layer 151 located on grooves 18. In some examples, shield layer 152 can fill grooves 18. In some examples, shield layer 152 can also be formed on ridges 1512 and ridge ledges 1511. In some examples, shield layer 152 can be formed by electroplating, spraying, or sputtering silver or nickel on shield layer 151. Shield layer 152 can have a thickness in the range from approximately 10 µm to approximately 20 µm. Shield layer 152 can prevent shield layer 151 from being oxidized or corroded.

Figure 2G:
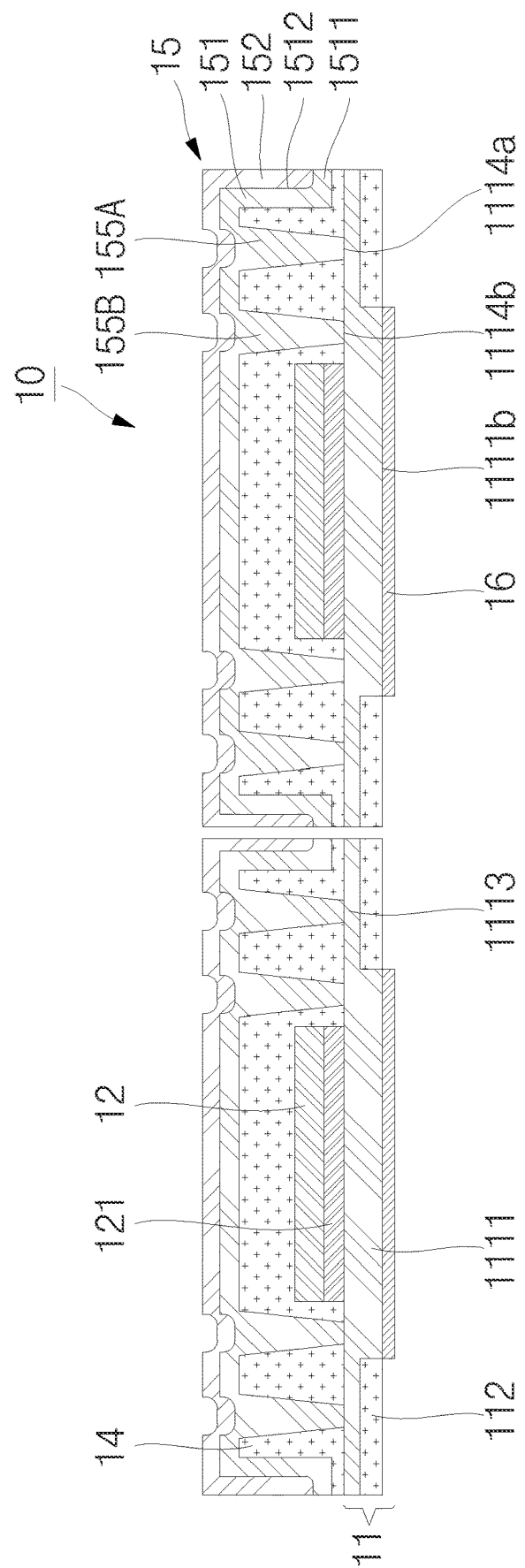

FIG. 2G shows a cross-sectional view of semiconductor device 10 at a later stage of manufacture. In the example shown in FIG. 2G, carrier 16 can be removed from substrate 11, and individual semiconductor devices 10 can be singulated from each other. In some examples, for removal of carrier 16, heat or light can be applied to reduce the adhesiveness between carrier 16 and substrate 11. In some examples, carrier 16 can be peeled off from substrate 11 using a physical force. Paddle bottom pad 1111*b* and interconnect terminal bottom pad 1112*b* (see FIG. 1A) can be formed on bottom side of paddle 1111 of substrate 11 and bottom sides of interconnect terminals 1112, respectively. In some examples, bottom pads 1111*b* and 1112*b* can comprise tin (Sn), Sn—Pb, Sn37-Pb, Sn95-Pb, Sn—Pb—Ag, Sn—Cu, Sn—Ag, Sn—Au, Sn—Bi, or Sn—Ag—Cu. Singulation can be performed by vertically sawing shield 15 and substrate 11 using a blade wheel or laser beam. In some examples, singulation can be performed along thickest regions in shield layers 151 and 152. In some examples, singulation can be performed by sawing shield layers 151 and 152 located between opposed ridges 1512 and sawing substrate 11 corresponding to shield layers 151 and 152 located between ridges 1512. After singulation, lateral side of shield layer 152, lateral side of shield layer 151, and lateral side of substrate 11 can be coplanar. Here, ridge ledges 1511 can be positioned between shield layer 152 and package body 14 or substrate 11.

As described above, since top and lateral sides of package body 14 can be covered by shield layers 151 or 152, the Electromagnetic Interference (EMI) shielding efficiency of semiconductor device 10 can be increased. Oxidation and corrosion of shield layer 151 can be prevented or reduced because shield layer 151, made from a metal such as copper having excellent electrical conductivity, is covered by shield layer 152 which is made from metal such as nickel having excellent oxidation resistance and corrosion resistance. Since shield layers 151 and 152 are electrically connected to shielding terminals 1114*a* or 1114*b* through at least one of shield interconnects 155A or 155B, EMI shielding efficiency of semiconductor device 10 can be increased.

In some examples, a method to manufacture semiconductor device 10 can include providing a substrate 11 comprising dielectric structure 112 and conductive structure 111, having a top side and a shielding terminal 1114*a* or 1114*b*, on the top side of conductive structure 111, providing electronic component 12 on the top side of conductive structure 111. The method can include providing package body 14 on the top side of conductive structure 111 and contacting a side of electronic component 12. In some examples, the method can include providing a via 17 in package body 14 from a top side of package body 14 to the shielding terminal 1114*a* or 1114*b* and providing shield 15 on a top side of package body 14 and a lateral side of package body 14.

In some examples, the shield 15 can include a shield interconnect 155A or 155B in the via 17 connecting shield 15 to the shielding terminal 1114*a* or 1114*b* of conductive structure 111. In some examples, the method can comprise providing the via 17 in package body 14 to expose the shielding terminal 1114*a* or 1114*b* prior to providing shield 15 on the top side of package body 14 and the side surface of package body 14.

In some examples, the method can include providing a seed layer 19 on the package body 14 prior to providing shield 15 on the top side of package body 14 and the side surface of package body 14. In some examples, the operation of providing a shield 15 can include providing a first shield layer 151 on the top side of package body 14 and the side surface of package body 14. The operation of providing a shield 15 further can include providing a second shield layer 152 on the first shield layer 151. In some examples, the method can further comprise providing a groove in package body 14 at the lateral side of package body 14. In some examples, the package body 14 can be exposed under shield 15 at the lateral side of package body 14.

Figure 3A:
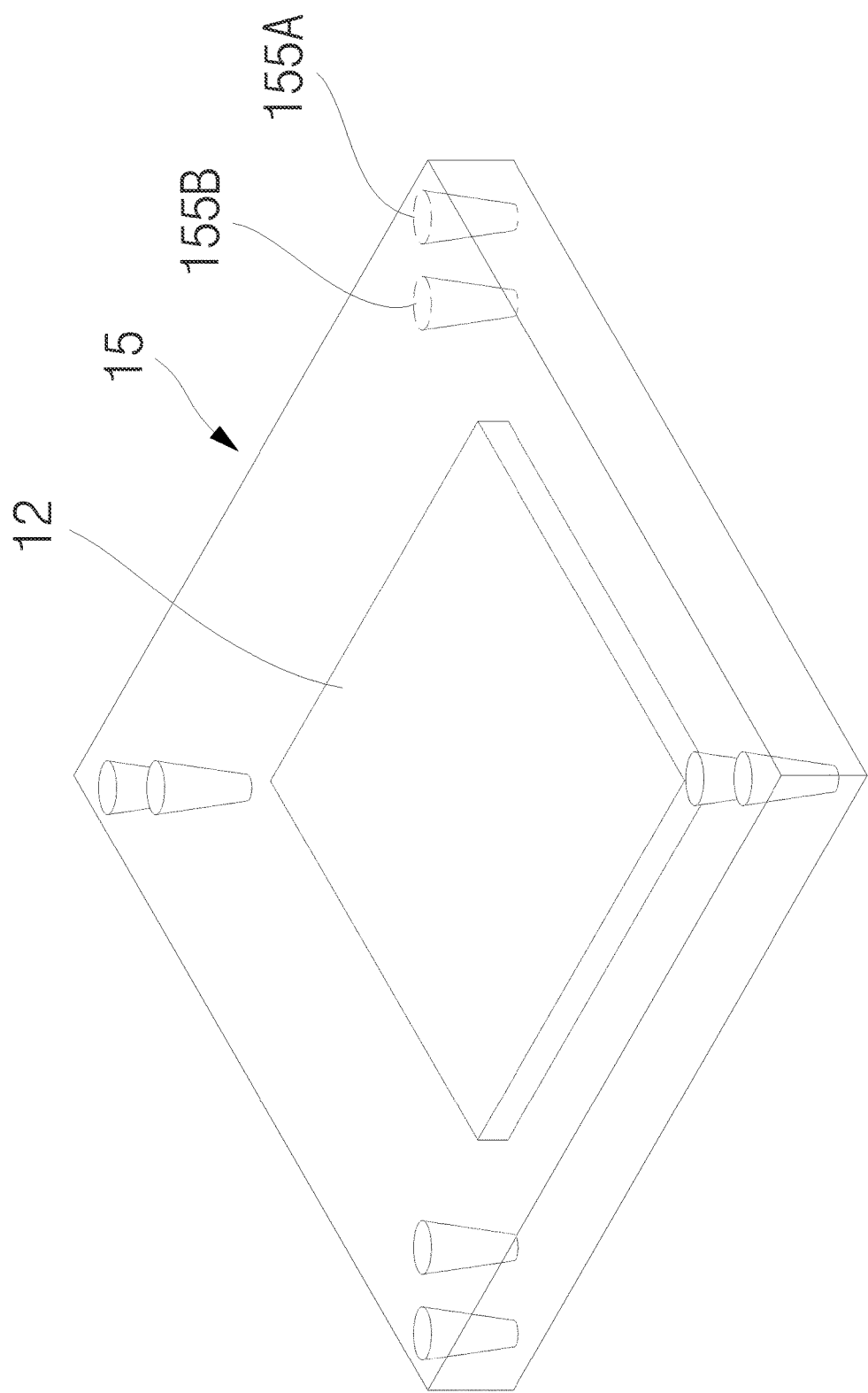
FIGS. 3A and 3B show a perspective view and a top plan view of a shield interconnect of an example semiconductor device, respectively.
Figure 3B:
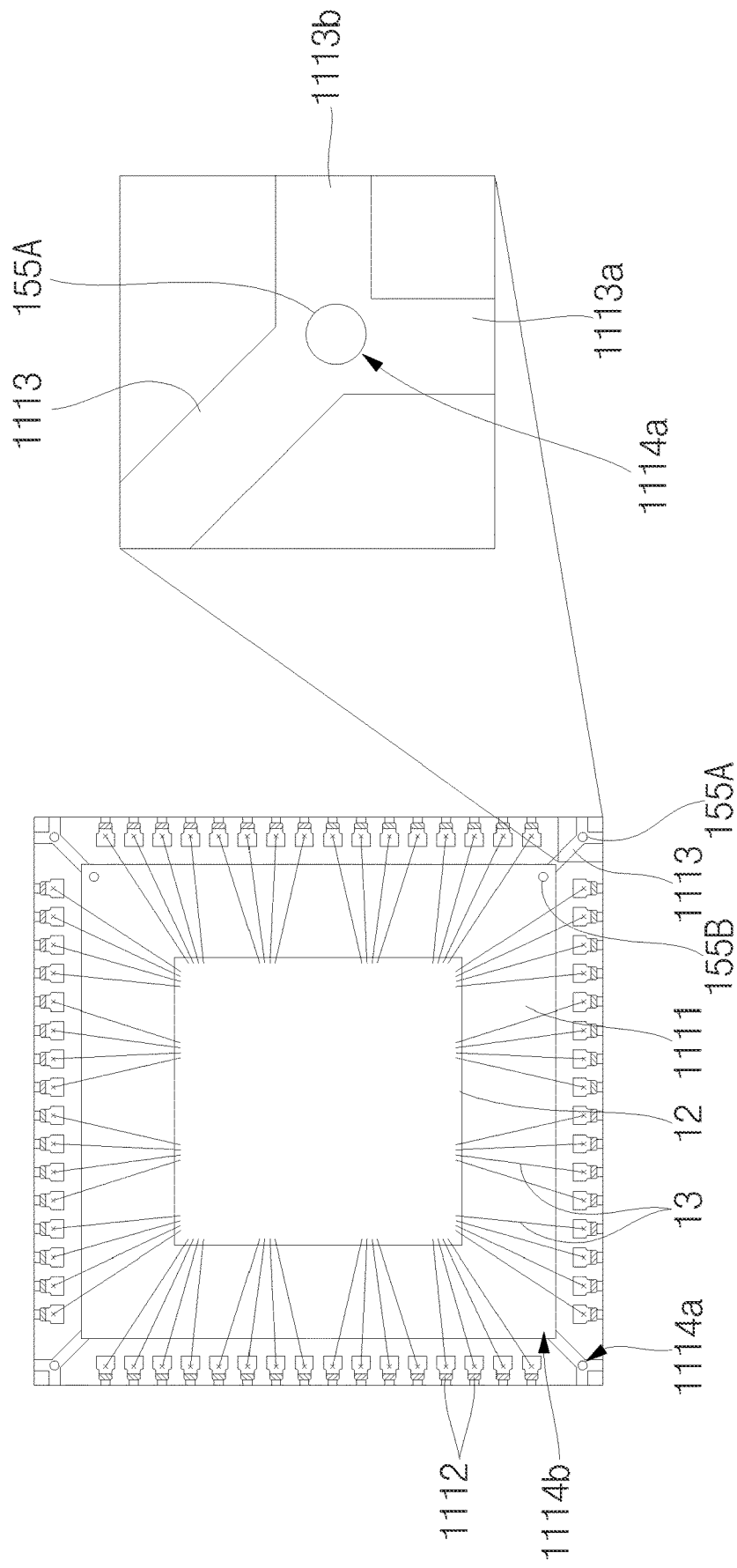

FIGS. 3A and 3B show a perspective view and a top plan view of a shield interconnect of an example semiconductor device 10, respectively. In the examples shown in FIGS. 3A and 3B, shield interconnects 155A or 155B can electrically connect shield layers 151 and 152 to shielding terminals 1114*a* or 1114*b*. Support bars 1113 can be diagonally extended out from four corners of paddle 1111 and can comprise division bars 1113*a* and 1113*b* divided at ends of support bars 1113 in two directions. In some examples, shield interconnects 155A can be formed at intersections of support bars 1113 and division bars 1113*a* and 1113*b*. Since four of support bars 1113 are provided, shield interconnects 155A can comprise four shield interconnects. Since support bars 1113 can be grounded through paddle 1111, shield layers 151 and 152 can also be grounded to increase the EMI shielding efficiency of semiconductor device 10. Shield interconnects 155B can be formed on grounded paddle 1111 to increase the EMI shielding efficiency of semiconductor device 10. In some examples, shield interconnects 155B can be formed at four corners of paddle 1111 adjacent to support bars 1113. Since paddle 1111 has four corners, shield interconnects 155B can also be provided with four shield interconnects. In some examples, shield interconnects 155B can also be formed on grounded interconnect terminals 1112. In some examples, shield interconnects 155A can be formed in support bars 1113, and shield interconnects 155B can be formed in grounded paddle 1111 or interconnect terminals 1112. As described above, multiple shield interconnects 155A or 155B can be formed at various positions according to the design of substrate 11, and shield 15 can be grounded, to increase the EMI shielding efficiency of semiconductor device 10 owing to shield 15. In some examples, conductive structure 111 comprises support bar 1113 having a division bar 1113*a* or 1113*b*, and the first shielding terminal 1114*a* or 1114*b* is on the division bar 1113*a* or 1113*b* or on a support bar 1113 at a juncture of division bar 1113*a* and 1113*b*.

Figure 4:
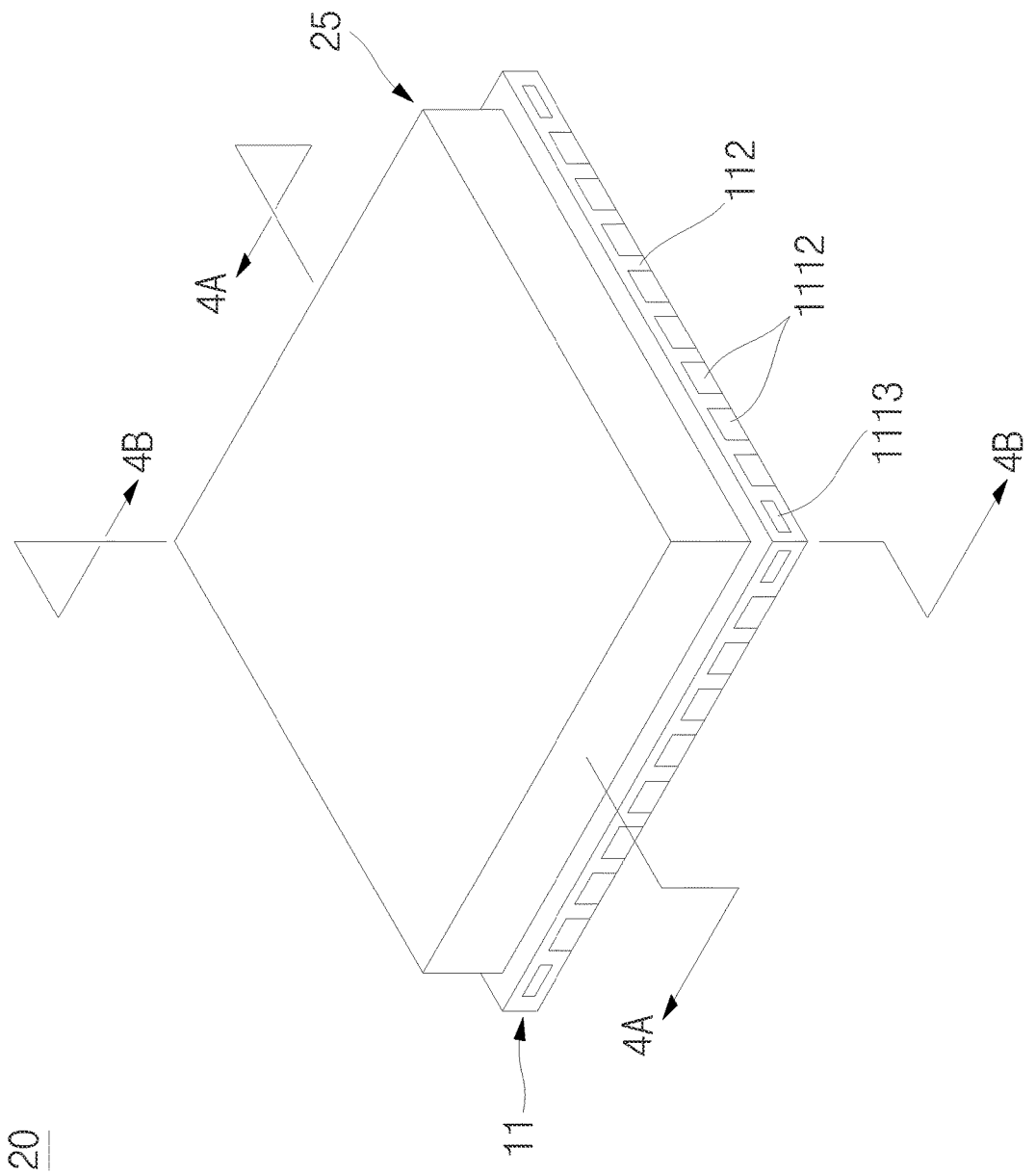
FIG. 4 shows a perspective view of an example semiconductor device.

FIG. 4 shows a perspective view of an example semiconductor device 20, and FIGS. 4A and 4B show cross-sectional views taken along line 4A-4A and 4B-4B of FIG. 4, respectively. In the examples shown in FIGS. 4, 4A, and 4B, semiconductor device 20 can comprise substrate 11, electronic component 12, component interconnects 13, package body 14, and shield 25. Features or elements of semiconductor device 20 can be similar to corresponding features or elements of other semiconductor devices described in this disclosure, such as those of semiconductor device 10 (FIGS. 1-3). Semiconductor device 20 comprises shield 25 having shield layer 251, ridge ledge 2511, ridge 2512 and shield interconnects 255, and shield interconnects 255 can electrically connect ridge ledge 2511 to substrate 11, shielding terminal 1114*a*, or support bars 1113.

Figure 5A:
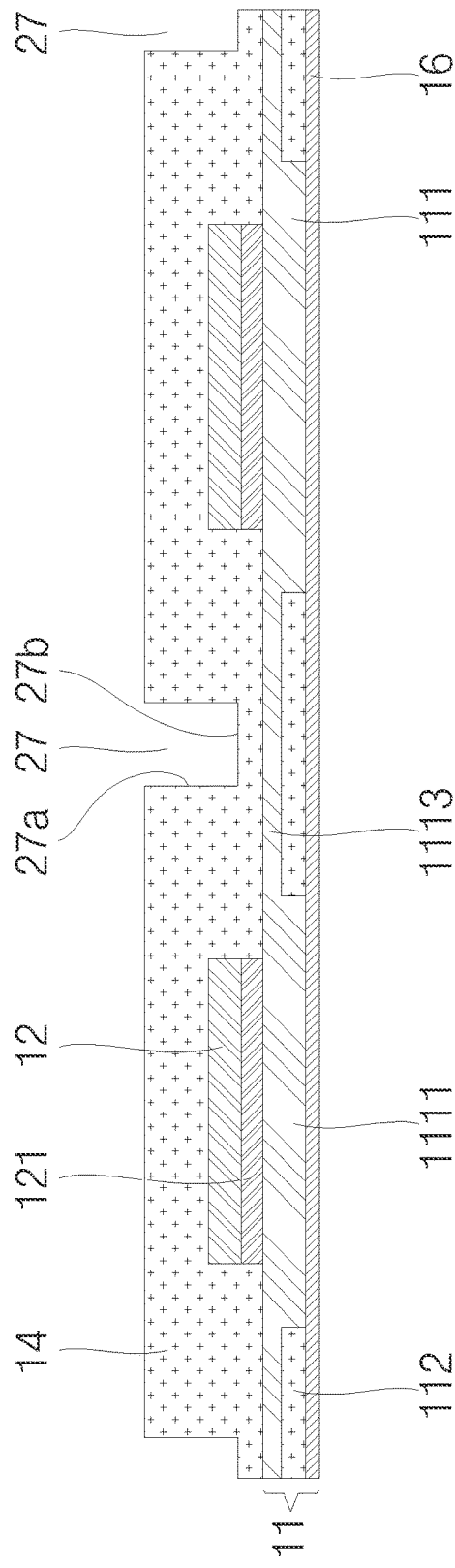

FIGS. 5A to 5D show cross-sectional views of an example method to manufacture an example semiconductor device 20. FIGS. 5A to 5D correspond to cross-sectional views taken along line 4B-4B of FIG. 4. FIG. 5A shows a cross-sectional view of semiconductor device 20 at a later stage of manufacture. Here, an operation prior to the operation shown in FIG. 5A can be similar to that shown in FIG. 2A.

In the example shown in FIG. 5A, grooves 27 can be formed in package body 14. In some examples, grooves 27 can be similar to grooves 18. Grooves 27 can comprise or can be referred to as trenches or channels. Grooves 27 can be formed through laser beam, mechanical drilling, a blade wheel, or chemical etching. In some examples, grooves 27 can be formed in regions corresponding to support bars 1113 or regions to be singulated in a subsequent process. Each of grooves 27 can have a lateral side 27a and a bottom side 27b. Lateral side 27a of each groove 27 can be substantially perpendicular to a lengthwise direction of substrate 11, and bottom side 27b of each groove 27 can be substantially parallel with lengthwise direction of substrate 11. In some examples, a region of package body 14 can remain under bottom side 27b of grooves 27. The region of package body 14 can have a thickness in the range from approximately 50 µm to approximately 150 µm. Grooves 27 (bottom side 27b) can have a width in the range from approximately 100 µm to approximately 700 µm. Lateral side 27a and bottom side 27b of groove 27 can provide a potential region where shield 25 is formed in a later process.

Figure 5B:
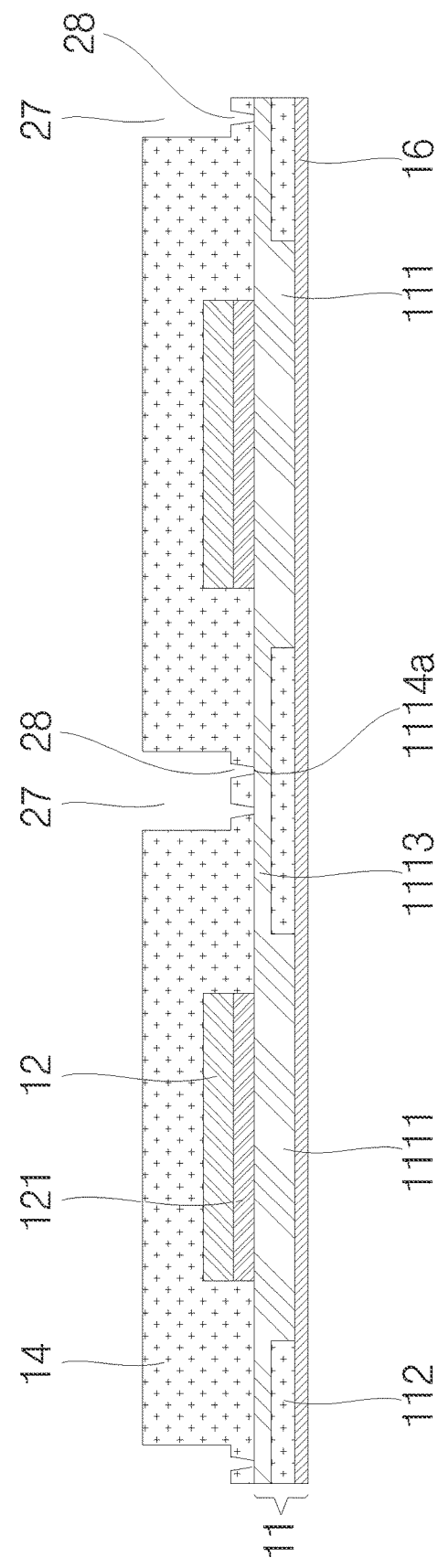

FIG. 5B shows a cross-sectional view of semiconductor device 20 at a later stage of manufacture. In the example shown in FIG. 5B, vias 28 can be formed in package body 14. In some examples, vias 28 can be formed in bottom sides 27b of grooves 27 of package body 14. Vias 28 can comprise or can be referred to as openings or through holes. Vias 28 can be formed by laser beam, mechanical drilling, or chemical etching. In some examples, diameters of vias 28 can be largest at the top ends and can be gradually reduced in diameter downwardly. Vias 28 can have a height in the range from approximately 50 µm to approximately 150 µm, or a diameter in the range from approximately 50 µm to approximately 100 µm. Vias 28 can pass through package body 14 to expose shielding terminals 1114a.

FIG. 5C shows a cross-sectional view of semiconductor device 20 at a later stage of manufacture. In the example shown in FIG. 5C, shield layer 251 can be formed on package body 14. In some examples, shield layer 251 can be formed on package body 14, grooves 27 located in package body 14, and vias 28 located in package body 14. Shield layer 251 can also be formed on shielding terminals 1114a exposed by vias 28. Shield layer 251 filling vias 28 can be defined as shield interconnects 255. In some examples, shield layer 251 can be made from a metal or a conductive paste material, for example silver or copper-filled epoxy. In some examples, shield layer 251 can be made from copper, nickel, silver, or stainless steel. In some examples, shield layer 251 can be formed using spraying, jet dispense, electroplating, electroless-plating, or sputtering. In some examples, prior to formation of shield layer 251, de-smearing can be performed to increase adhesiveness with shield layer 251 by removing epoxy smear that can exist inside grooves 27 or vias 28 or increasing roughness. Shield layer 251 can have a thickness in the range from approximately 1 µm to approximately 20 µm, shield interconnects 255 can have a height in the range from approximately 50 µm to approximately 150 µm, and a diameter in the range from approximately 50 µm to approximately 100 µm.

FIG. 5D shows a cross-sectional view of semiconductor device 20 at a later stage of manufacture. In the example shown in FIG. 5D, carrier 16 is removed from substrate 11 and individual semiconductor devices 20 can be singulated from each other. Singulation can be performed by vertically sawing shield 251 and substrate 11 using a blade wheel or laser beam. In some examples, singulation can be performed along outer regions of shield interconnects 255 in shield layer 251. In some examples, singulation can be performed by sawing shield layer 251 located between opposed ridges 2512 and sawing substrate 11 corresponding to shield layer 251 located between ridges 2512. Ridge ledge 2511 of shield layer 251 located on bottom side 27b of groove 27 can protrude laterally further than ridge 2512 shield layer 251 located on lateral side 27a of groove 27. Ridge ledges 2511 can have a width in the range from approximately 100 µm to approximately 200 µm to allow shield interconnects 255 to be stably positioned.

As described above, shield interconnects 255 of shield 25 can electrically connect shield layer 251 to shielding terminals 114a. Since support bars 1113 can be diagonally extended out from four corners of paddle 1111, four of shield interconnects 255 can also be formed at shielding terminals 114a corresponding to support bars 1113. In some examples, support bars 1113 and shield 25 can be grounded through paddle 1111 to increase EMI shielding efficiency of semiconductor device 20.

Figure 6:
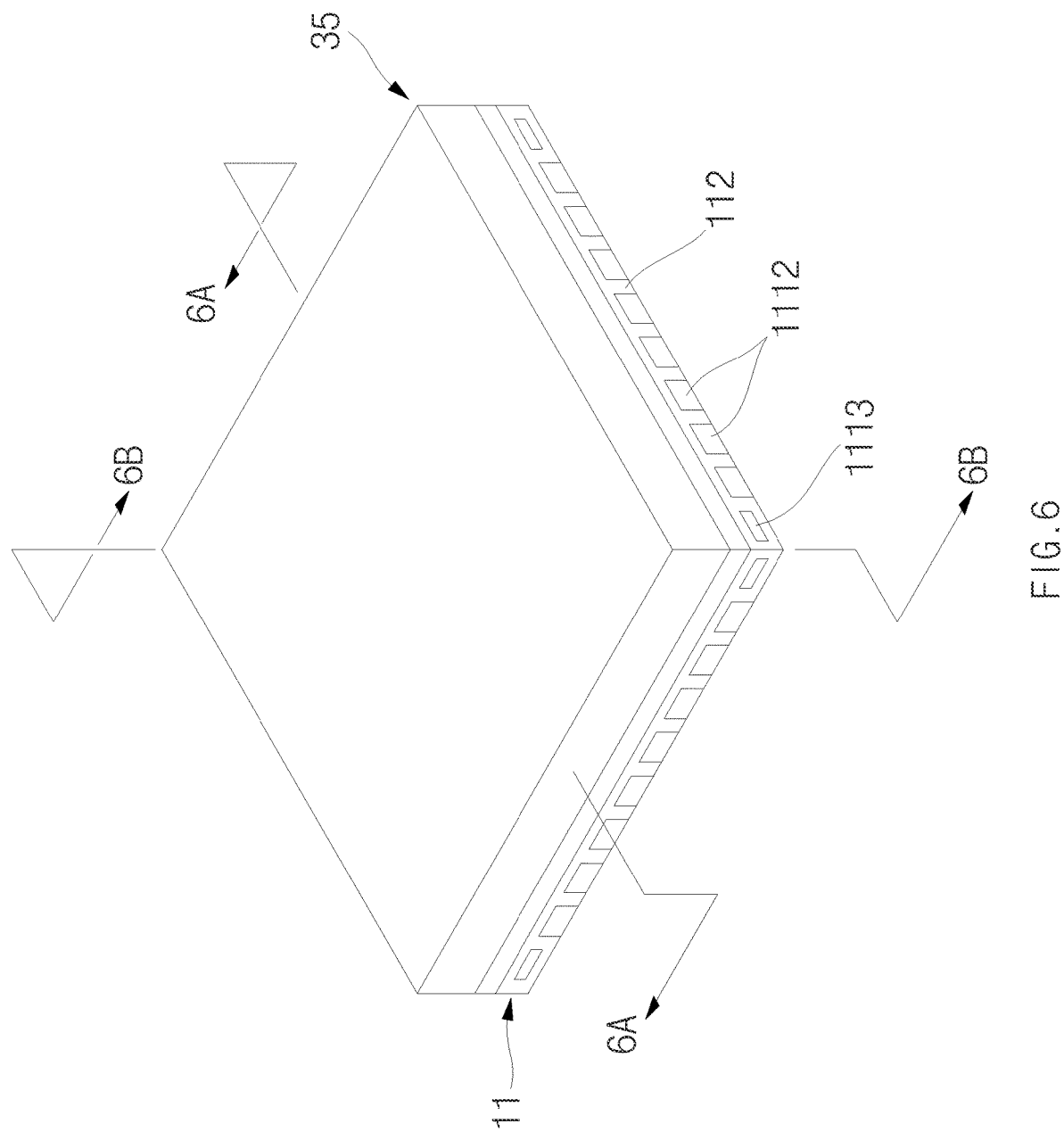
FIG. 6 shows a perspective view of an example semiconductor device.

FIG. 6 shows a perspective view of an example semiconductor device 30 and FIGS. 6A and 6B show cross-sectional views taken along line 6A-6A and 6B-6B of FIG. 6, respectively. In the examples shown in FIGS. 6, 6A and 6B, semiconductor device 30 can comprise substrate 11, electronic component 12, component interconnects 13, package body 14, and shield 35. Features or elements of semiconductor device 30 can be similar to corresponding features or elements of other semiconductor devices described in this disclosure, such as those of semiconductor device 20 (FIGS. 4-5). Semiconductor device 30 comprises shield 35 having shield layers 151 and 152, ridge ledges 1511, ridges 1512, and shield interconnects 355, and shield interconnects 355 can electrically connect ridge ledges 1511 to substrate 11, shielding terminal 1114a, or support bars 1113.

Figure 7C:
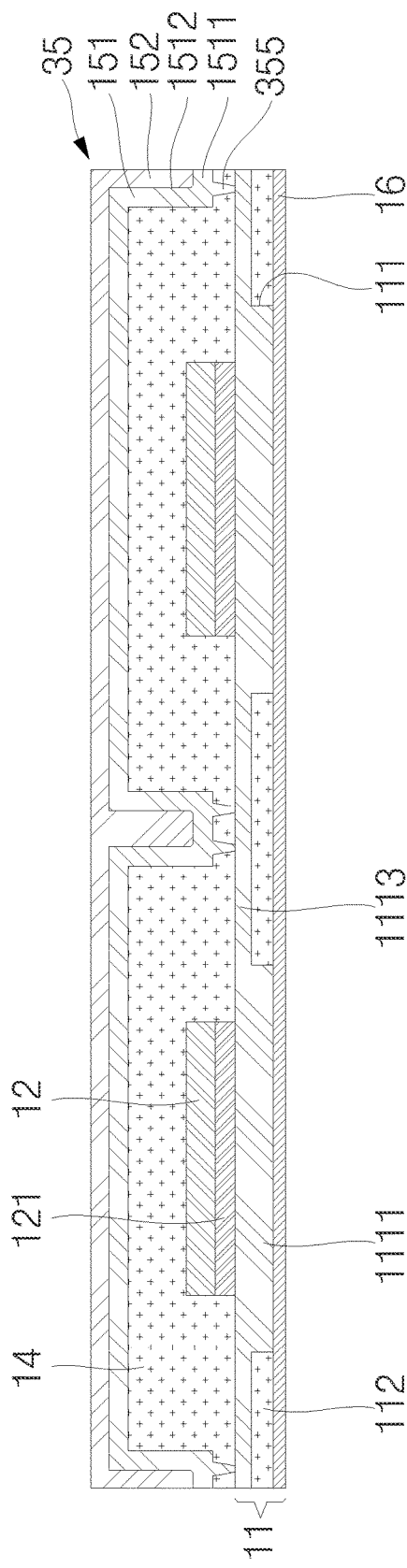

FIGS. 7A to 7D show cross-sectional views of an example method for manufacturing an example semiconductor device 30. FIGS. 7A to 7D correspond to cross-sectional views taken along line 6B-6B of FIG. 6. FIG. 7A shows a cross-sectional view of semiconductor device 30 at a later stage of manufacture. Here, operations prior to the operation shown in FIG. 7A can be similar to those shown in FIGS. 5A and 5B.

In the example shown in FIG. 7A, seed layer 19 can be formed on package body 14. In some examples, seed layer 19 can be formed on package body 14, grooves 27 located in package body 14, and vias 28 located in package body 14. Seed layer 19 can also be formed on regions of shielding terminals 1114a exposed by vias 28. Seed layer 19 can be made from a metal. For example, seed layer 19 can be made from titanium, titanium tungsten, or copper. In some examples, seed layer 19 can be formed by electroless plating or by sputtering. In some examples, prior to forming seed layer 19, de-smearing can be performed to improve adhesiveness with seed layer 19 by removing epoxy smear that can exist inside groove 27 or vias 28 or increasing roughness. Seed layer 19 can have a thickness in the range from approximately 1 µm to approximately 3 µm.

FIG. 7B shows a cross-sectional view of semiconductor device 30 at a later stage of manufacture. In the example shown in FIG. 7B, shield layer 151 can be formed on seed layer 19. In some examples, shield layer 151 can be formed on seed layer 19 of package body 14, seed layer 19 located on grooves 27, and seed layer 19 vias 28. In some examples, shield layer 151 can fill vias 28. Shield layer 151 filling vias 28 can be electrically connected to shielding terminals 1114a through seed layer 19. Shield layer 151 filling vias 28 can be defined as shield interconnects 355. In some examples, a region of shield layer 151 located on a region corresponding to lateral side 27a of each of grooves 27 can be defined as ridge 1512, and a region of shield layer 151 located on a region corresponding to bottom side 27b of each of grooves 27 can be defined as ridge ledge 1511. In some examples, shield layer 151 can be formed by electroplating aluminum or copper on seed layer 19. Shield layer 151 can have a thickness in the range from approximately 10 μm to approximately 20 μm. Shield layer 151 can prevent an electromagnetic wave from being transmitted from an external component to electronic component 12 or can prevent an electromagnetic wave from being transmitted from electronic component 12 to an external component.

FIG. 7C shows a cross-sectional view of semiconductor device 30 at a later stage of manufacture. In the example shown in FIG. 7C, shield layer 152 can be formed on shield layer 151. In some examples, shield layer 152 can be formed on shield layer 151 located on package body 14, shield layer 151 located on grooves 27, and shield layer 151 filling vias 28. In some examples, shield layer 152 can fill grooves 27. In some examples, shield layer 152 can also be formed on ridges 1512 and ridge ledges 1511. In some examples, shield layer 152 can be formed by electroplating silver or nickel on shield layer 151. Shield layer 152 can have a thickness in the range from approximately 10 μm to approximately 20 μm. Shield layer 152 can prevent shield layer 151 from being oxidized or corroded.

Figure 7D:
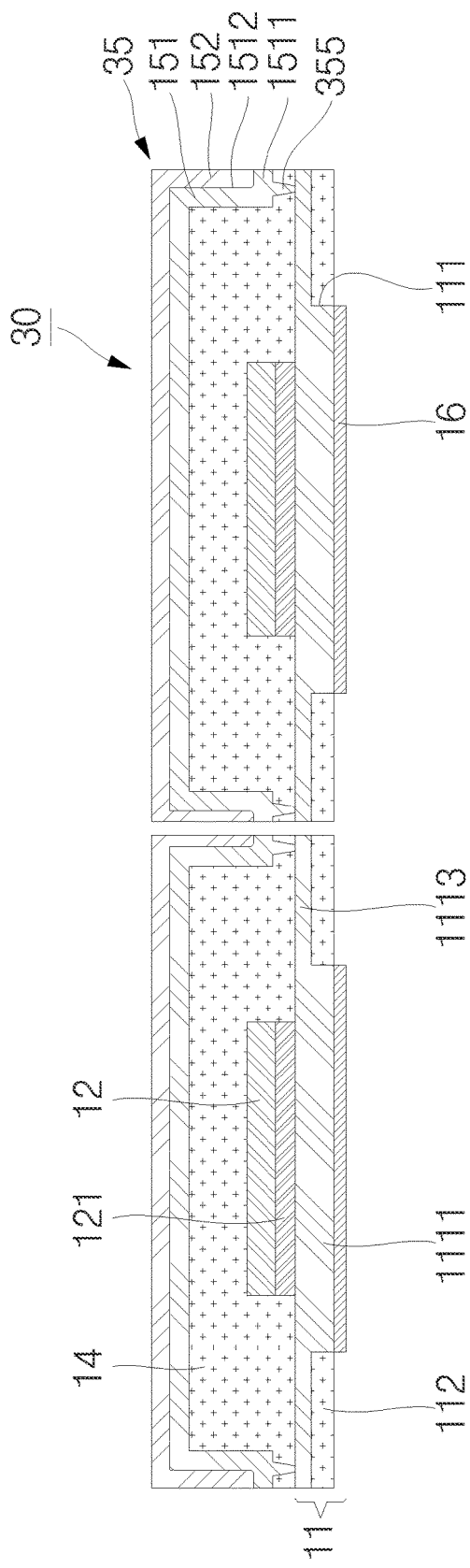

FIG. 7D shows a cross-sectional view of semiconductor device 30 at a later stage of manufacture. In the example shown in FIG. 7D, carrier 16 is removed from substrate 11 and individual semiconductor devices 30 can be singulated from each other. Singulation can be performed by sawing shield layers 151 and 152 and substrate 11 using a blade wheel or laser beam. In some examples, singulation can be performed along thickest regions of outer regions of shield interconnects 355 of shield layers 151 and 152. In some examples, singulation can be performed by sawing shield layers 151 and 152 located between opposed ridges 1512 and sawing substrate 11 corresponding to shield layers 151 and 152 located between ridges 1512. After singulation, lateral side of shield layer 151, lateral side of shield layer 152 and lateral side of substrate 11 can be coplanar.

Figure 8A:
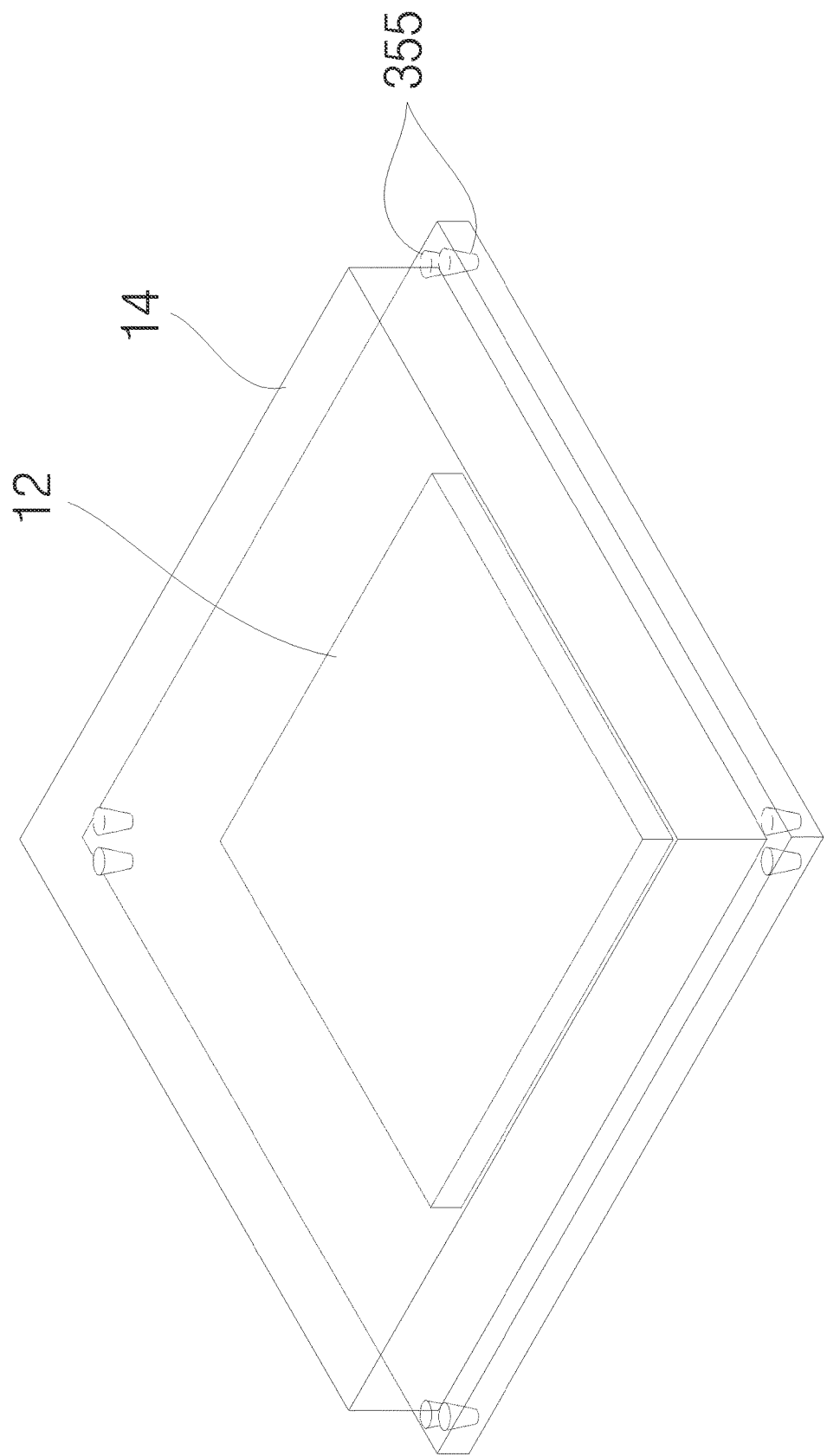
FIGS. 8A and 8B show a perspective view and a top plan view of a shield interconnect of an example semiconductor device, respectively.
Figure 8B:
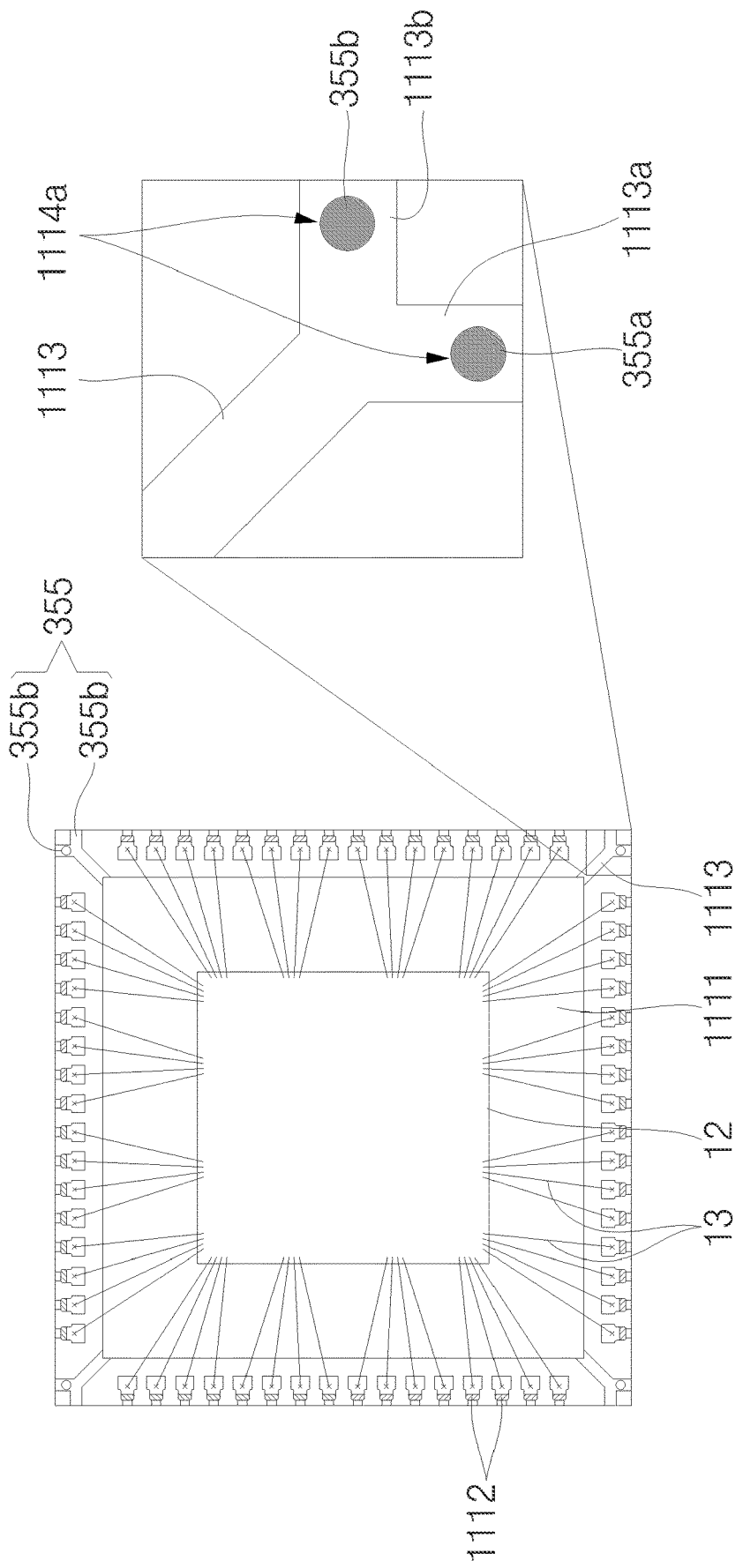

FIGS. 8A and 8B show a perspective view and a top plan view of a shield interconnect of semiconductor device 30, respectively. In the examples shown in FIGS. 8A and 8B, shield interconnects 355 can electrically connect shield layers 151 and 152 to shielding terminals 1114a. Shield interconnects 355 connected to support bars 1113 can include at least one or more shield interconnects. Since support bars 1113 can be diagonally extended out from four corners of paddle 1111, shield interconnects 355 can also be provided with four shield interconnects at regions corresponding to support bars 1113. In some examples, support bars 1113 can comprise division bars 1113a and 1113b divided at ends of support bars 1113 in two directions. Shield interconnects 355a and 355b can be formed in division bars 1113a and 1113b, respectively. In some examples, since support bars 1113 can be grounded through paddle 1111, shield 35 can also be grounded to enhance EMI shielding efficiency of semiconductor device 30.

Figure 9:
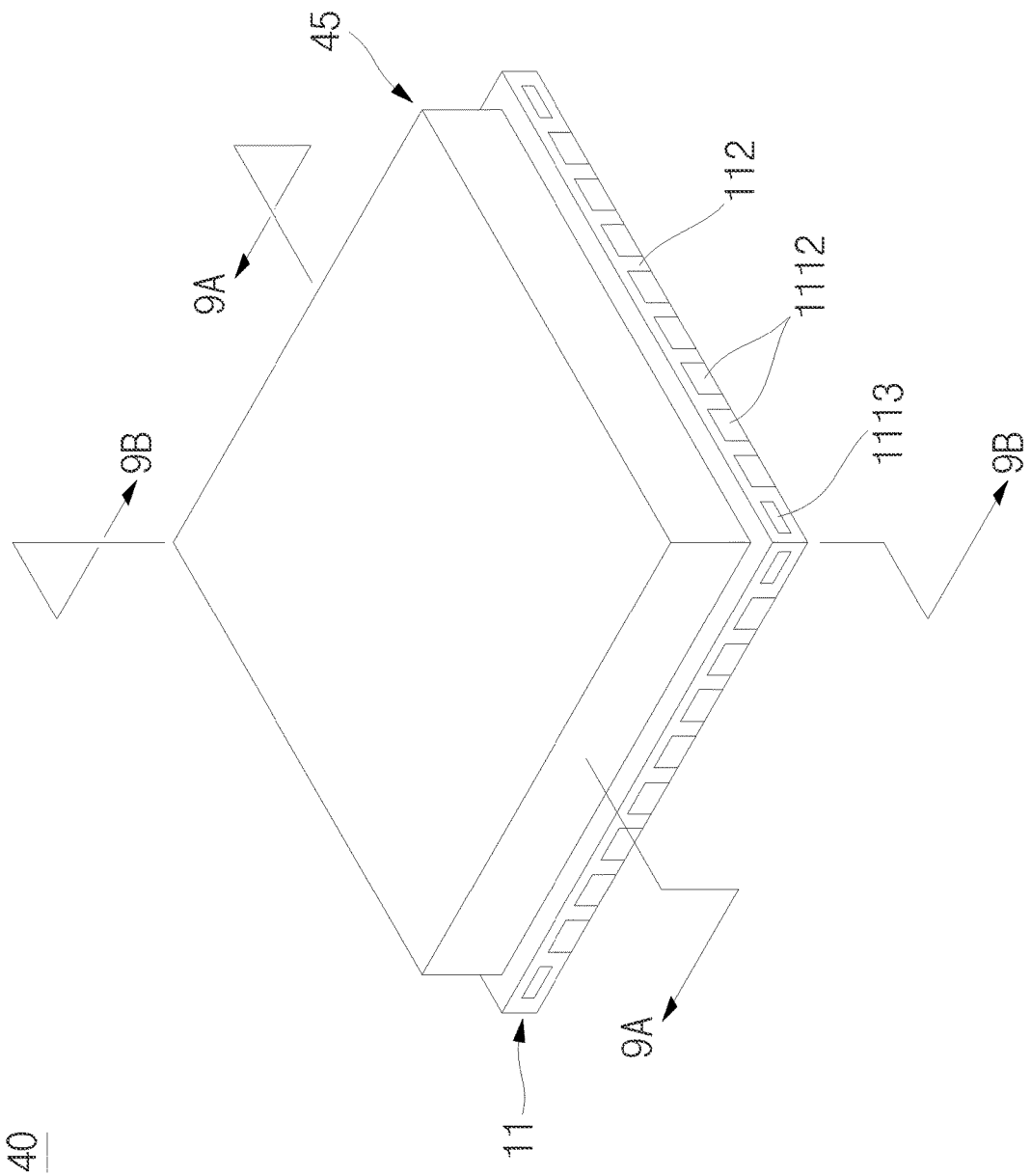
FIG. 9 shows a perspective view of an example semiconductor device.
Figure 9A:
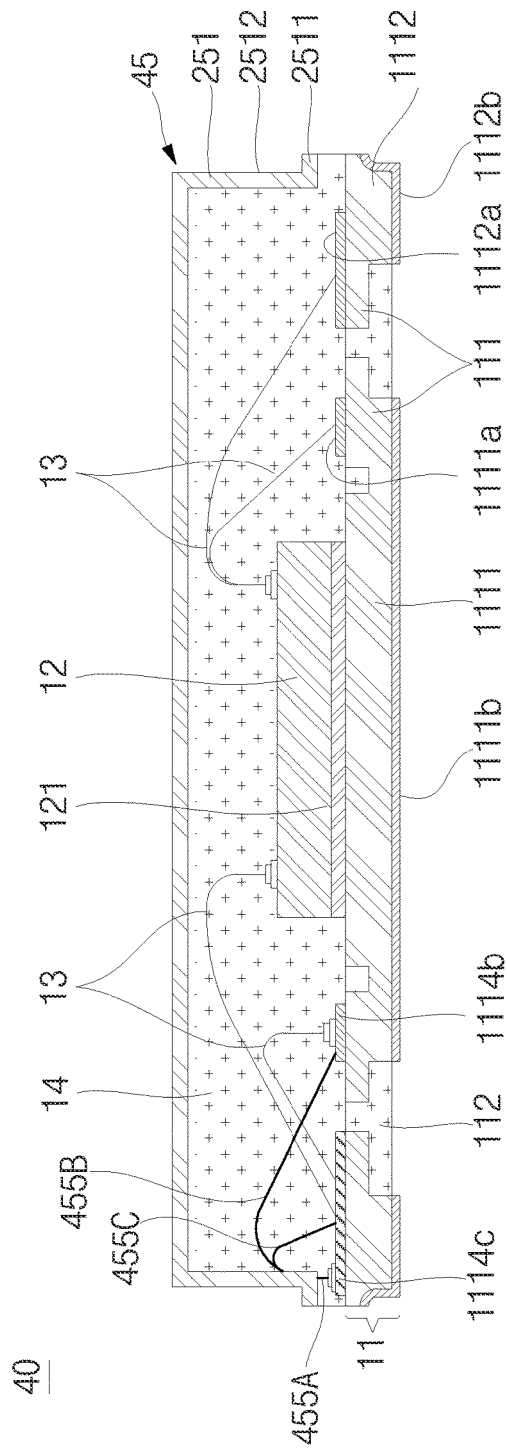
FIGS. 9A and 9B show cross-sectional views of an example semiconductor device.
Figure 9B:
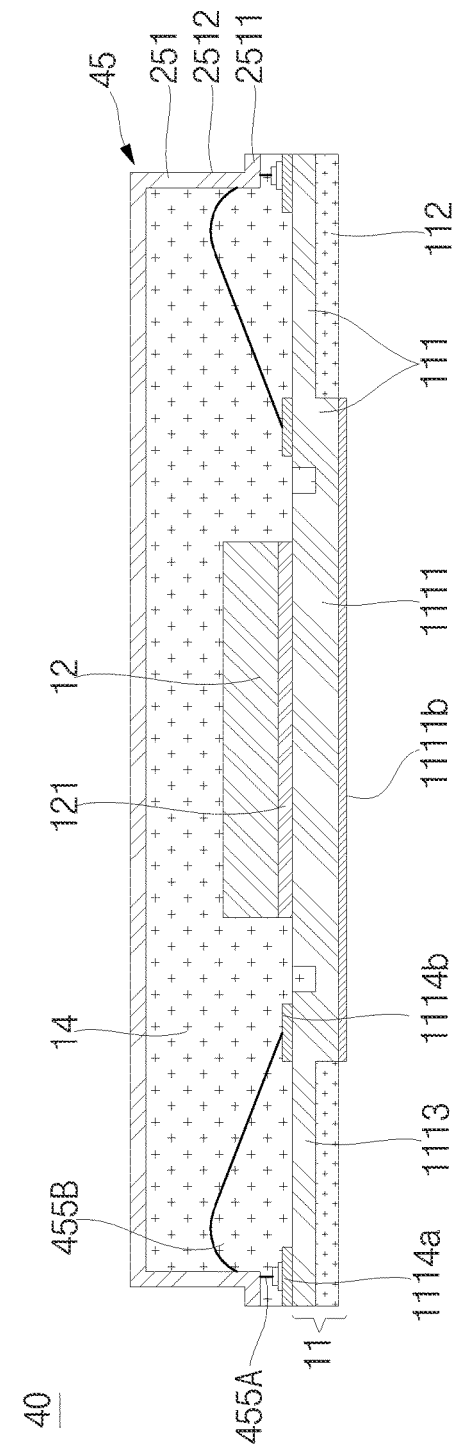

FIG. 9 shows a perspective view of an example semiconductor device 40, and FIG. 9A and FIG. 9B shows cross-sectional views taken along line 9A-9A, 9B-9B of FIG. 9, respectively. In the examples shown in FIGS. 9, 9A, and 9B, semiconductor device 40 can comprise substrate 11, electronic component 12, component interconnects 13, package body 14 and shield 45. Features or elements of semiconductor device 40 can be similar to corresponding features or elements of other semiconductor devices described in this disclosure. Semiconductor device 40 can comprise shield 45 having shield layer 251, ridge ledge 2511, or ridge 2512. Shield interconnects 455A, 455B, or 455C can electrically connect shield 45 to grounding or shielding terminals 1114a, 1114b, or 1114c of substrate 11. In some examples, shielding terminals 1114a can be on or can be part of support bar 1113, shielding terminals 1114b can be on or can be part of paddle 1111, or shielding terminals 1114c can be on or can be part of interconnect terminals 1112. In some examples, shield interconnects 455A, 455B, or 455C can comprise a via or define a via in package body 14.

Figure 10C:
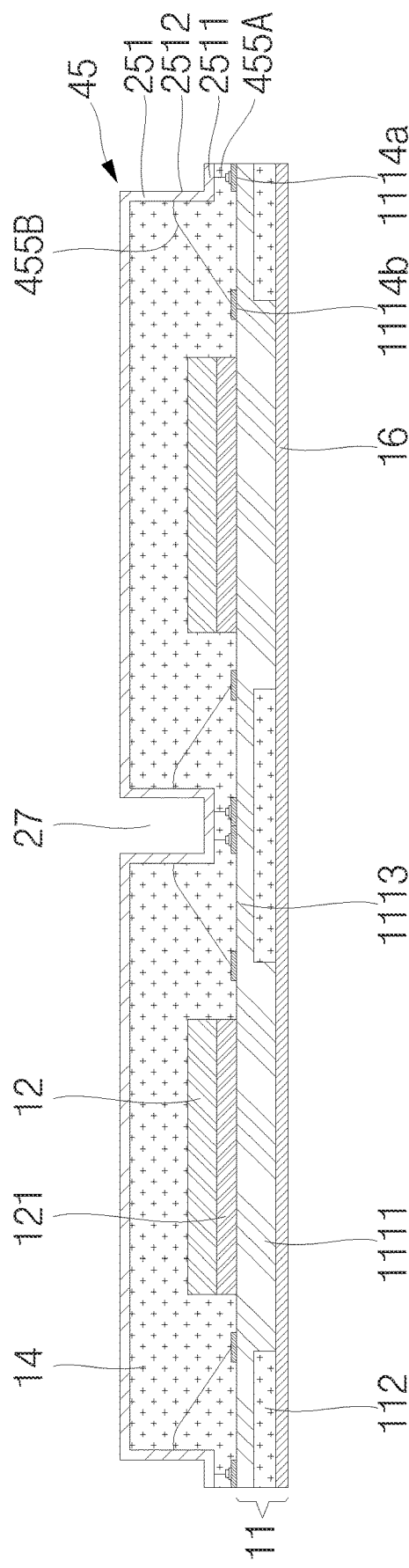

FIGS. 10A to 10D show cross-sectional views of an example method for manufacturing an example semiconductor device 40. FIG. 10A shows a cross-sectional view of semiconductor device 40 at an early stage of manufacture.

FIG. 10A shows shield interconnects 455 coupling shield 45 to substrate 11. In some examples, shield interconnects 455 can be formed between shielding terminals 1114a of support bar 1113 and shielding terminals 1114b of paddle 1111. Shield interconnects 455 can comprise or can be referred to as wires or wire bonds. Shield interconnects 455 can comprise gold, silver, copper, or aluminum. In some examples, first ends of shield interconnects 455 can be ball-bonded to shielding terminals 1114a and second ends of shield interconnects 455 can be stitch-bonded to shielding terminals 1114a, so loop heights of shield interconnects 455 can be largest adjacent to shielding terminals 1114a. In some examples, first ends of shield interconnects 455 can be ball-bonded to shielding terminals 1114b and second ends of shield interconnects 455 can be stitch-bonded to shielding terminals 1114a, so the loop heights of shield interconnects 455 can be largest adjacent to shielding terminals 1114b. Shield interconnects 455 can have loop heights in the range from approximately 50 μm to approximately 300 μm and diameters in the range from approximately 10 μm to approximately 50 μm. Shield interconnects 455 can be divided into two shield interconnects 455A and 455B in a later process, and can be electrically connected to shield layer 251, respectively. After formation of shield interconnects 455, electronic component 12 and shield interconnects 455 can be covered by package body 14.

FIG. 10B shows a cross-sectional view of semiconductor device 40 at a later stage of manufacture. In the example shown in FIG. 10B, grooves 27 can be formed in package body 14. Grooves 27 can comprise or can be referred to as trenches or channels. Grooves 27 can be formed through laser beam, mechanical drilling, or chemical etching. In some examples, grooves 27 can be formed in regions corresponding to shield interconnects 455 or regions to be singulated in a later process. Accordingly, shield interconnects 455 can be divided into respective shield interconnects 455A, 455B, or 455C. Each of grooves 27 can have a lateral side 27a and a bottom side 27b. An edge of shield interconnect 455A can be exposed through bottom side 27b of groove 27, and an edge of shield interconnect 455B can be exposed through lateral side 27a of groove 27. In some examples, shield interconnect 455A can define a via in package body 14 by, extending from the top side of package body 14 (at bottom side 27b of groove 27) to shielding terminal 1114a or 1114c. Lateral side 27a of each groove 27 can be substantially perpendicular to top side of substrate 11, and bottom side 27b of each groove 27 can be substantially parallel with top side of substrate 11. A region of package body 14 can remain under bottom side 27b of groove 27. The region of package body 14 remaining under bottom side 27b of groove 27 can have a thickness in the range from approximately 50 µm to approximately 150 µm. Grooves 27 (bottom side 27b) can have a width in the range from approximately 100 µm to approximately 700 µm. Lateral side 27a and bottom side 27b of groove 27 can provide a potential region where shield 45 is formed in a later process.

FIG. 10C shows a cross-sectional view of semiconductor device 40 at a later stage of manufacture. In the example shown in FIG. 10C, shield layer 251 can be formed on package body 14. In some examples, shield layer 251 can be formed on package body 14 and grooves 27 located in package body 14. Shield layer 251 can be electrically connected to the edge of shield interconnect 455A exposed through bottom side 27b of groove 27 and can be electrically connected to the edge of shield interconnect 455B exposed through lateral side 27a of groove 27. Shield layer 251 can be made from a metal or a conductive paste material, for example silver or copper-filled epoxy. In some examples, shield layer 251 can be made from copper, nickel, silver, or stainless steel. In some examples, prior to formation of shield layer 251, de-smearing can be performed to improve adhesiveness with shield layer 251 by removing epoxy smear that can exist inside grooves 27 or increasing roughness. Shield layer 251 can have a thickness in the range from approximately 1 µm to approximately 20 µm.

Figure 10D:
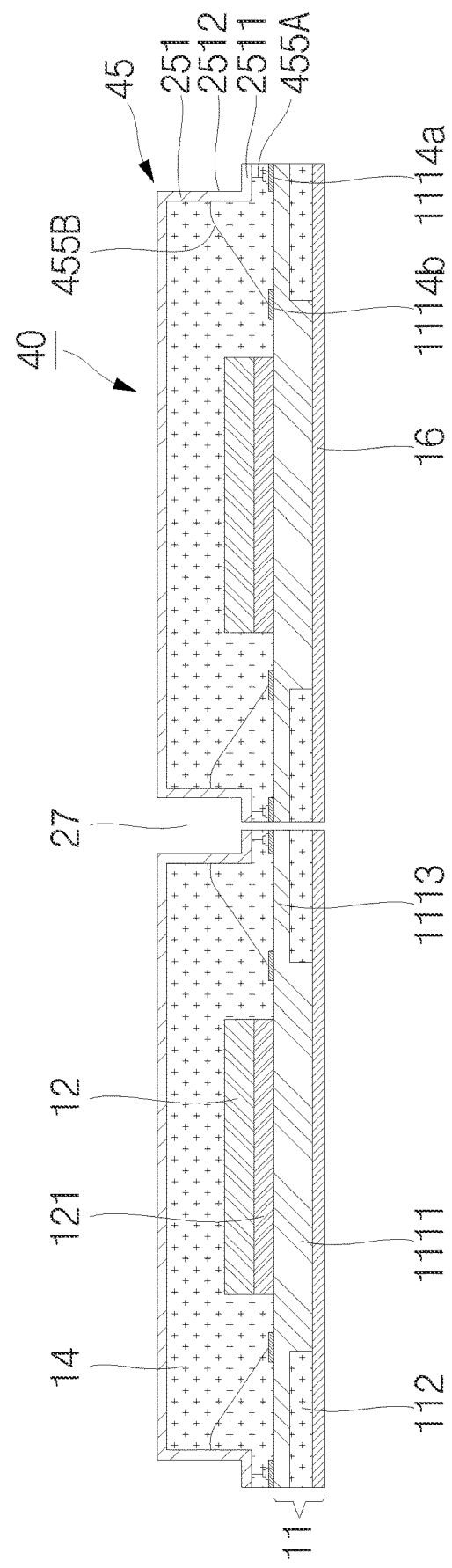

FIG. 10D shows a cross-sectional view of semiconductor device 40 at a later stage of manufacture. In the example shown in FIG. 10D, carrier 16 is removed and individual semiconductor devices 40 can be singulated from each other. Singulation can be performed by vertically sawing shield 251 and substrate 11 using a blade wheel or laser beam. In some examples, singulation can be performed by sawing shield layer 251 located between opposed ridges 2512 and sawing substrate 11 corresponding to shield layer 251 located between ridges 2512.

As described above, shield interconnect 455A can electrically connect shield layer 251 to shielding terminals 1114a, and shield interconnect 455B can electrically connect shield layer 251 to shielding terminals 1114b. Since shielding terminal 1114b at paddle 1111 and shielding terminals 1114a at support bars 1113 can be grounded, shield 45 can also be grounded to increase EMI shielding efficiency of semiconductor device 40.

Figure 11A:
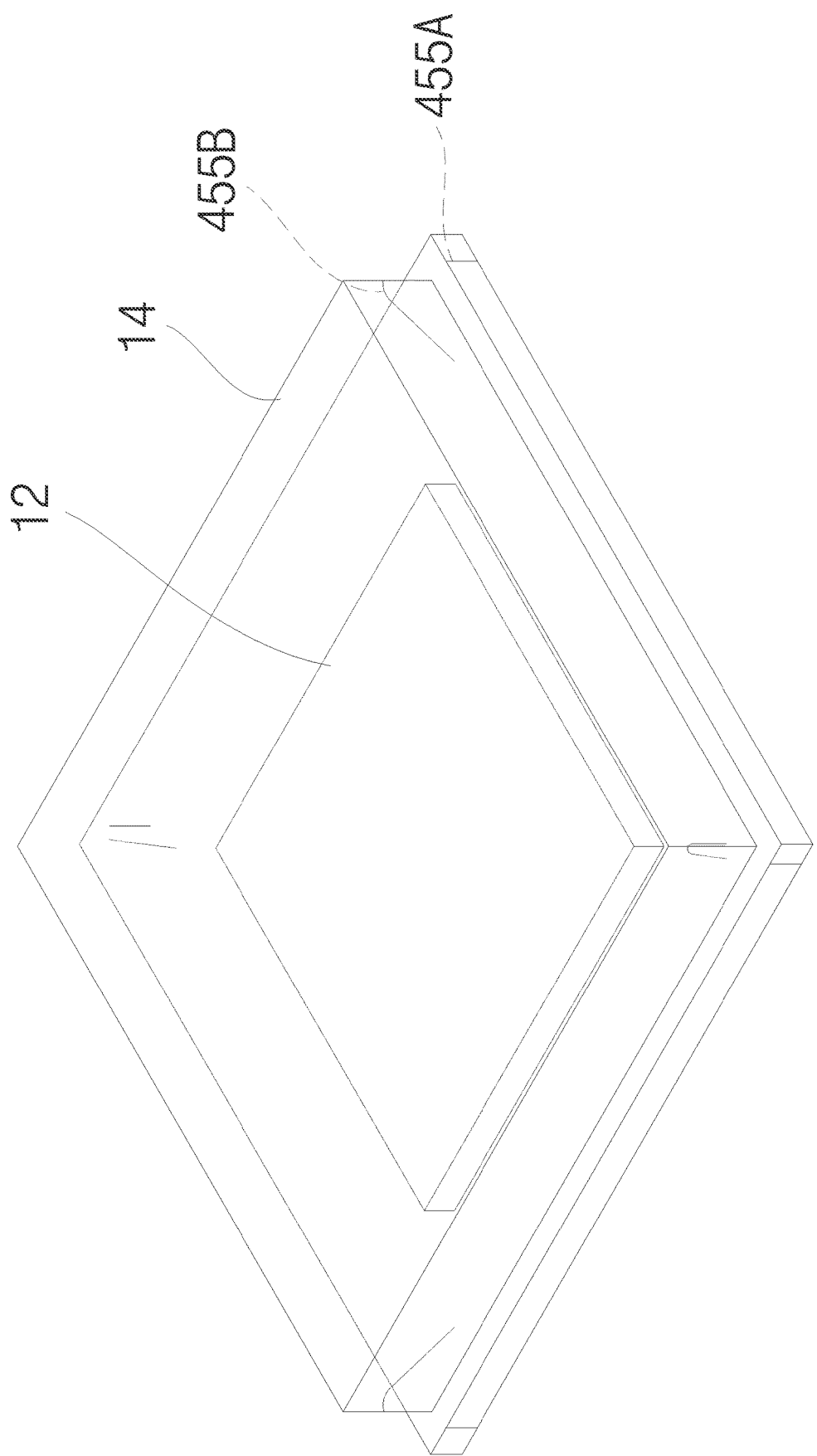
FIGS. 11A to 11B show a perspective view and a top plan view of a shield interconnect of an example semiconductor device, respectively.
Figure 11B:
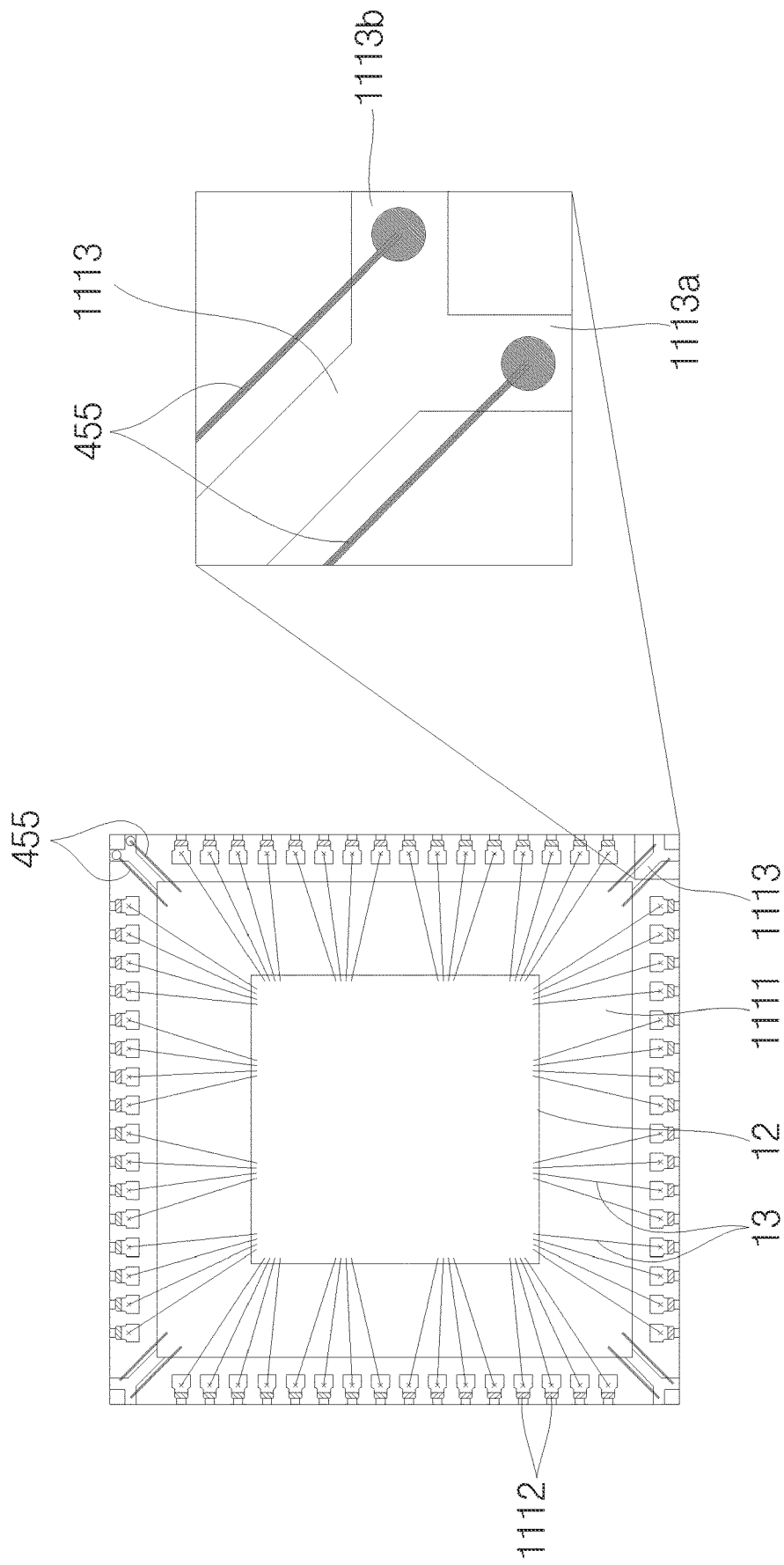

FIGS. 11A and 11B show a perspective view and a top plan view of a shield interconnect of an example semiconductor device 40, respectively. In the examples shown in FIGS. 11A and 11B, as described above, shield interconnects 455 can electrically connect shield layer 251 to paddle 1111 and support bars 1113. Shield interconnects 455 connected to paddle 1111 and support bars 1113 can be provided with at least one or more shield interconnects. Since support bars 1113 can be diagonally extended out from four corners of paddle 1111, four of shield interconnects 455 can also be formed at regions corresponding to support bars 1113. In some examples, first-end shield interconnect 455 can be connected between division bar 1113a and paddle 1111 and second-end shield interconnect 455 can be connected between division bar 1113b and paddle 1111. In some examples, support bars 1113 can be grounded through paddle 1111, shield 45 can also be grounded to increase EMI shielding efficiency of semiconductor device 40.

Figure 12A:
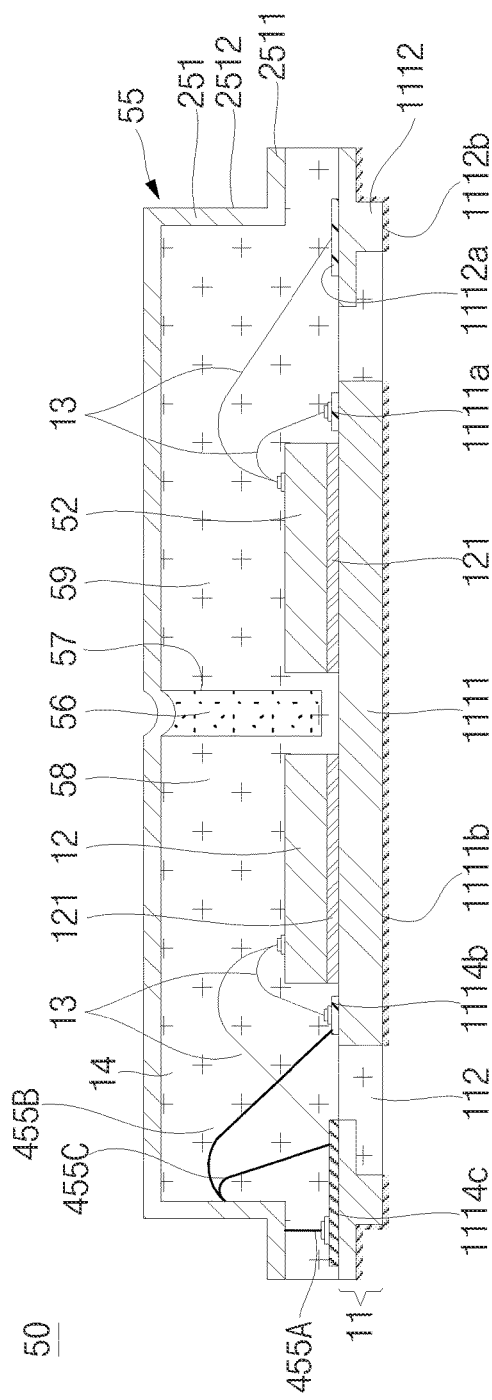
FIGS. 12A to 12B show cross-sectional views of an example semiconductor device.
Figure 12B:
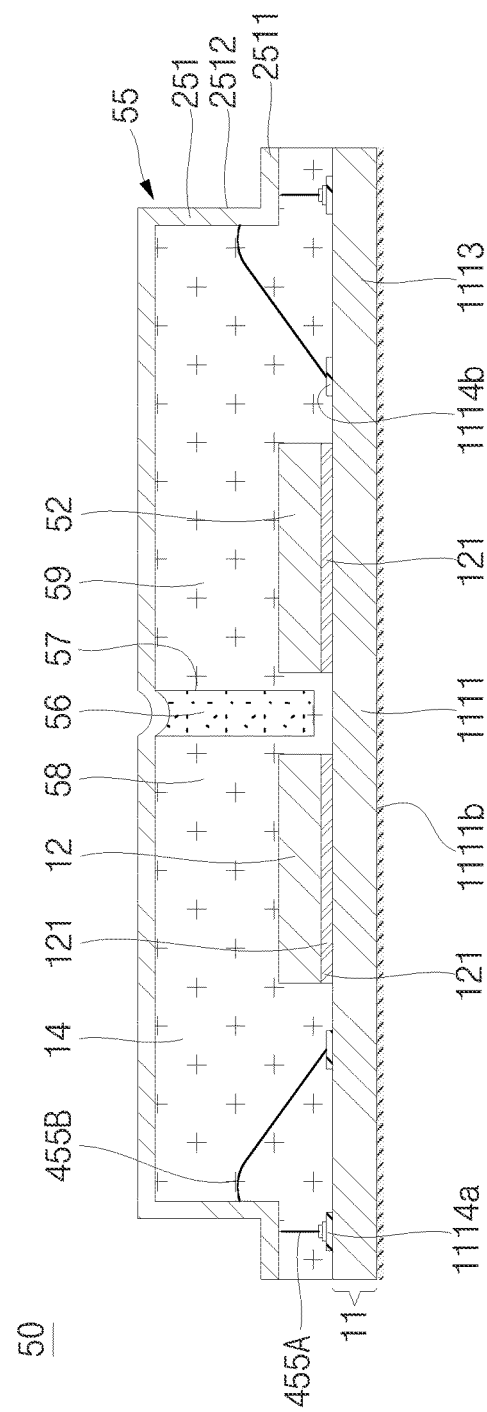

FIGS. 12A-12B show cross-sectional views of an example semiconductor device 50. Features or elements of semiconductor device 50 can be similar to corresponding features or elements of other semiconductor devices described in this disclosure. For instance, semiconductor device 50 can be similar in terms of structure or formation to semiconductor device 40 (FIGS. 9-11), the view of FIG. 12A can correspond to aspects of FIG. 9A, and the view of FIG. 12B can correspond to aspects of FIG. 9B.

Semiconductor device 50 can comprise substrate 11, electronic component 12, electronic component 52, component interconnects 13, package body 14, and shield 55. Shield 55 can comprise shield layer 251, ridge ledge 2511, ridge 2512, shield interconnects 455A and 455B, and shield interconnects 455A and 455B can electrically connect ridge ledge 2511 to shielding terminals 1114a of substrate 11.

Semiconductor device 50 can be compartmentalized, with compartment 58 containing one or more components such as electronic component 12, and with compartment 59 containing one or more components such as electronic component 52. In some examples, shield 55 can be similar to shield 45 or other shields described here.

Compartments 58 and 59 can be demarcated by, or substantially EMI-shielded from each other by, shield wall 56. Shield wall 56 can be positioned between compartments 58 and 59 and between electronic component 12 and electronic component 52, and that can contact or extend from shield 55 towards substrate 11. In some examples, shield wall 56 can extend adjacent to substrate 11, but a gap can remain between the bottom of shield wall 56 and substrate 11. In some examples, such gap can be filled by package body 14. In some examples, a height of the gap between the bottom of shield wall 56 and substrate 11 can be less than half of, or less than a quarter of, a height of electronic component 12 or 52 above substrate 11. In some examples, the height of the gap can be at least 150 microns. In some examples, the bottom of shield wall 56 can reach or be coupled to substrate 11.

In some examples, the formation or material of shield wall 56 can be similar any of the formation or materials options described with respect to any of the shield layers disclosed here, such as shield layer 251. In some examples groove 57 can be defined or formed into package body 14, similar to groove 18 or 27 previously described. Shield wall 56 can be filled into groove 57 such that the top of shield wall 56 remains exposed from package body 14 and is contacted by shield 55 later applied. As an example, shield wall 56 can be applied as a conductive paste into groove 57, and shield 55 can be applied by spraying, sputtering, plating, or otherwise over package body 14 and the top of shield wall 56.

Figure 13A:
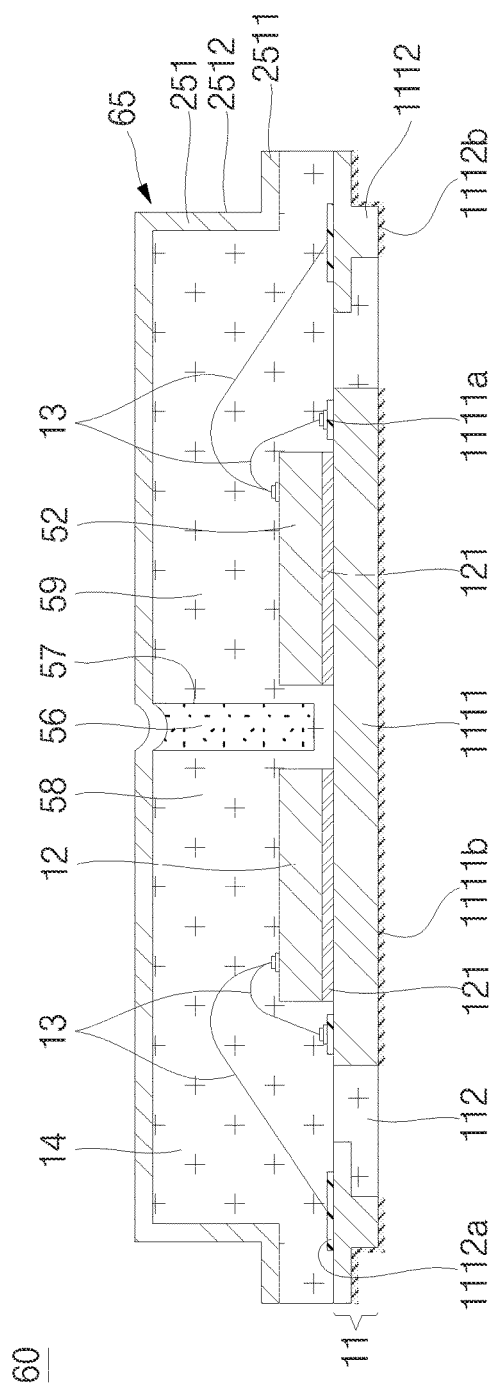
FIGS. 13A to 13B show cross-sectional views of an example semiconductor device.
Figure 13B:
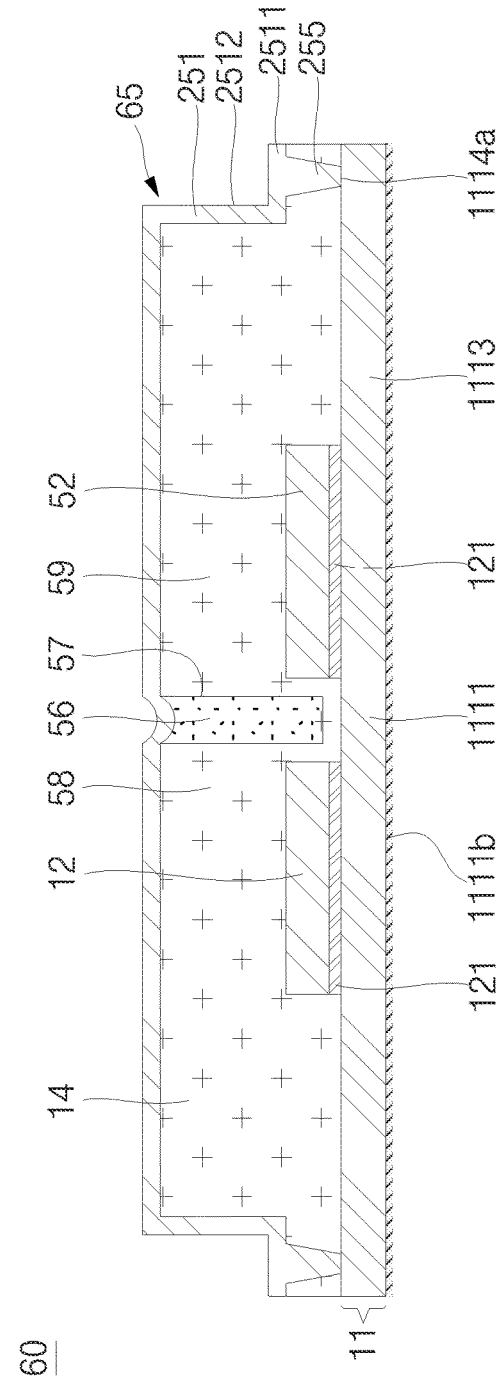

FIGS. 13A-13B show cross-sectional views of an example semiconductor device 60. Features or elements of semiconductor device 60 can be similar to corresponding features or elements of other semiconductor devices described in this disclosure. For instance, semiconductor device 60 can be similar in terms of structure or formation to semiconductor device 50 (FIGS. 12A-12B) or semiconductor device 20 (FIGS. 4-5), the view of FIG. 13A can correspond to aspects of FIG. 4A or FIG. 12A, and the view of FIG. 13B can correspond to aspects of FIG. 4B or 12B.

Semiconductor device 60 can comprise substrate 11, electronic component 12, electronic component 52, component interconnects 13, package body 14, and shield 65. Shield 65 can comprise shield layer 251, ridge ledge 2511, ridge 2512, and shield interconnects 255, and shield interconnects 255 can electrically connect ridge ledge 2511 to shielding terminals 1114a of substrate 11.

Semiconductor device 60 can be compartmentalized, with compartment 58 containing one or more components such as electronic component 12, and with compartment 59 containing one or more components such as electronic component 52. In some examples, shield 65 can be similar to shield 45 or other shields described here.

Compartments 58 and 59 can be demarcated by, or substantially EMI-shielded from each other by, shield wall 56. Shield wall 56 can be positioned between compartments 58 and 59 and between electronic component 12 and electronic component 52, and that can contact or extend from shield 65 towards substrate 11. In some examples shield wall 56 can extend adjacent to substrate 11, but a gap can remain between the bottom of shield wall 56 and substrate 11. In some examples, such a gap can be filled by package body 14. In some examples, a height of the gap between the bottom of shield wall 56 and substrate 11 can be less than half of, or less than a quarter of, a height of electronic component 12 or 52 above substrate 11. In some examples, the height of the gap can be at least 150 microns. In some examples, the bottom of shield wall 56 can reach or be coupled to substrate 11.

In some examples, the formation or material of shield wall 56 can be similar any of the formation or materials options described with respect to any of the shield layers disclosed here, such as shield layer 251. In some examples groove 57 can be defined or formed into package body 14, similar to groove 18 or 27 previously described. Shield wall 56 can be filled into groove 57 such that the top of shield wall 56 remains exposed from package body 14 and is contacted by shield 55 later applied. As an example, shield wall 56 can be applied as a conductive paste into groove 57, and shield 55 can be applied by spraying, sputtering, plating, or otherwise over package body 14 and the top of shield wall 56.

In some examples, semiconductor device 60 can be a semiconductor structure comprising substrate 11 that includes dielectric structure 112 and conductive structure 111. The conductive structure 111 can have a top side, paddle 1111, and a shielding terminal 1114a on the top side of conductive structure 111. The semiconductor device 60 can include a first electronic component 12 on the top side of conductive structure 111 on paddle 1111, and a second electronic component 52 on the top side of conductive structure 1111 on paddle 1111. In some examples, the package body 14 can be on the top side of conductive structure 111 and contacting a side of the first electronic component 12 and a side of the second electronic component 52.

The semiconductor device 60 can include a shield 65 on a top side of package body 14 and on a side surface of package body 14, and a shield wall 56 between the first electronic component 12 and the second electronic component 52 and contacting shield 65. The semiconductor device 60 also can include a shield interconnect 255 coupling shield 65 to the shielding terminal 1114a of conductive structure 111. In some examples, the shield wall 56 defines a first compartment 58 that contains the first electronic device 12 but not the second electronic device 52, and a second compartment 59 that contains the second electronic device 52 but not the first electronic device 12. In some examples, shield interconnect 255 comprises a wire 13.

The present disclosure includes reference to certain examples. It will be understood, however, by those skilled in the art that various changes may be made, and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. A semiconductor structure, comprising:
   a substrate comprising a dielectric structure and a conductive structure having a top side, a paddle, and a shielding terminal on the top side of the conductive structure;
   a first electronic component on the top side of the conductive structure on the paddle, and a second electronic component on the top side of the conductive structure on the paddle;
   a package body on the top side of the conductive structure and contacting a side of the first electronic component and a side of the second electronic component;
   a shield on a top side of the package body and a side surface of the package body; and
   a shield wall between the first electronic component and the second electronic component and contacting the package body and the shield;
   wherein the shield comprises a shield interconnect coupled to the shielding terminal of the conductive structure, wherein the shield interconnect comprises a portion of the shield extending into the package body.

2. The semiconductor structure of claim 1, wherein the shield wall defines a first compartment that contains the first electronic component but not the second electronic component, and a second compartment that contains the second electronic component but not the first electronic component.

3. The semiconductor structure of claim 1, wherein the horizontally extending support bar has a division bar extending at a non-zero angle with respect to the horizontally extending support bar, and the shielding terminal is on the division bar.

4. The semiconductor structure of claim 1, wherein the package body comprises a groove, and the shield wall is in the groove.

5. The semiconductor structure of claim 4, wherein the shield wall completely fills the groove.

6. The semiconductor structure of claim 1, wherein the package body extends below the shield wall.

7. A method to manufacture a semiconductor structure, comprising:
   providing a substrate comprising a dielectric structure and a conductive structure having a top side, a paddle, and a shielding terminal on the top side of the conductive structure;
   providing a first electronic component on the top side of the conductive structure on the paddle, and a second electronic component on the top side of the conductive structure on the paddle;
   providing a package body on the top side of the conductive structure and contacting a side of the first electronic component and a side of the second electronic component;
   providing a shield wall between the first electronic component and the second electronic component and contacting the package body;
   providing a shield on a top side of the package body and a side surface of the package body and contacting the shield wall; and
   providing a shield interconnect coupling the shield to the shielding terminal of the conductive structure;
   wherein conductive structure comprises a horizontally extending support bar, and the shielding terminal is on the horizontally extending support bar;

wherein the shield interconnect is coupled with the horizontally extending support bar; and wherein the horizontally extending support bar has a first division bar and a second division bar, wherein the shielding terminal comprises a first shielding terminal on the first division bar and a second shielding terminal on the second division bar, and wherein the shield interconnect comprises a first wire coupled with the first shielding terminal and a second wire coupled with the second shielding terminal.

8. The method of claim 7, wherein the shield wall defines a first compartment that contains the first electronic component but not the second electronic component, and a second compartment that contains the second electronic component but not the first electronic component.

9. The method of claim 7, comprising:

providing a groove in the package body prior to providing the shield wall, and the shield wall is provided in the groove.

10. A semiconductor structure, comprising:

a substrate comprising a dielectric structure and a conductive structure having a top side, a paddle, and a shielding terminal on the top side of the conductive structure;

a first electronic component on the top side of the conductive structure on the paddle, and a second electronic component on the top side of the conductive structure on the paddle;

a package body on the top side of the conductive structure and contacting a side of the first electronic component and a side of the second electronic component;

a shield on a top side of the package body and a side surface of the package body;

a shield wall between the first electronic component and the second electronic component and contacting the package body and the shield; and a shield interconnect coupling the shield to the shielding terminal of the conductive structure, wherein conductive structure comprises a horizontally extending support bar, and the shielding terminal is on the horizontally extending support bar;

wherein the shield interconnect is coupled with the horizontally extending support bar; and wherein the horizontally extending support bar has a first division bar and a second division bar, wherein the shielding terminal comprises a first shielding terminal on the first division bar and a second shielding terminal on the second division bar, and wherein the shield interconnect comprises a first wire coupled with the first shielding terminal and a second wire coupled with the second shielding terminal.

11. The semiconductor structure of claim 10, wherein the shield wall defines a first compartment that contains the first electronic component but not the second electronic component, and a second compartment that contains the second electronic component but not the first electronic component.

12. The semiconductor structure of claim 10, wherein the shield interconnect comprises a wire.

13. The semiconductor structure of claim 10, wherein the shield interconnect comprises a via structure.

14. The semiconductor structure of claim 10, wherein the package body comprises a groove, and the shield wall is in the groove.

15. The semiconductor structure of claim 14, wherein the shield wall completely fills the groove.

16. The semiconductor structure of claim 10, wherein the package body extends below the shield wall.

* * * * *